(12) United States Patent
Millward et al.

(10) Patent No.: US 8,071,467 B2
(45) Date of Patent: Dec. 6, 2011

(54) METHODS OF FORMING PATTERNS, AND METHODS OF FORMING INTEGRATED CIRCUITS

(75) Inventors: Dan Millward, Boise, ID (US); Scott Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/755,672

(22) Filed: Apr. 7, 2010

(65) Prior Publication Data
US 2011/0250745 A1 Oct. 13, 2011

(51) Int. Cl.
*H01L 21/3205* (2006.01)
(52) U.S. Cl. .................. 438/591; 257/E21.433
(58) Field of Classification Search .................. 438/591; 257/E21.433
See application file for complete search history.

(56) References Cited

U.S. PATENT DOCUMENTS

| | | | |
|---|---|---|---|
| 6,794,111 B2 | 9/2004 | Nishi et al. | |
| 7,531,296 B2 | 5/2009 | Chang et al. | |
| 7,651,829 B2 | 1/2010 | Hamada et al. | |
| 2004/0122179 A1 | 6/2004 | Ober et al. | |
| 2005/0215039 A1* | 9/2005 | Hill et al. | 438/585 |
| 2006/0124467 A1* | 6/2006 | Ho et al. | 205/118 |
| 2008/0193658 A1* | 8/2008 | Millward | 427/401 |
| 2009/0020786 A1 | 1/2009 | Lenoble et al. | |
| 2009/0117360 A1 | 5/2009 | Clevenger et al. | |
| 2010/0102415 A1 | 4/2010 | Millward et al. | |

OTHER PUBLICATIONS

Jinan Chai et al., "Using Cylindrical Domains of Block Copolymers to Self-Assemble and Align Metallic Nanowires", ACS Nano, vol. 2, No. 3, published online Feb. 5, 2008, pp. 489-501.
Jinan Chai et al., "Assembly of Aligned Linear Metallic Patterns on Silicon", Nature Nanotechnology, vol. 2, Aug. 2007, pp. 500-506.
Soojin Park et al., "From Nanorings to Nanodots by Patterning with Block Copolymers", Nano Letters, Apr. 30, 2008, vol. 8, No. 6, pp. 1667-1672.
Jennifer N. Cha et al., "Biomimetic Approaches for Fabricating High-Density Nanopatterned Arrays", Chem. Mater. Jan. 20, 2007, 19, 839-843.

* cited by examiner

*Primary Examiner* — Alexander Ghyka
*Assistant Examiner* — Stanetta Isaac
(74) *Attorney, Agent, or Firm* — Wells St. John P.S.

(57) ABSTRACT

Some embodiments include methods of forming patterns in substrates by utilizing block copolymer assemblies as patterning materials. A block copolymer assembly may be formed over a substrate, with the assembly having first and second subunits arranged in a pattern of two or more domains. Metal may be selectively coupled to the first subunits relative to the second subunits to form a pattern of metal-containing regions and non-metal-containing regions. At least some of the block copolymer may be removed to form a patterned mask corresponding to the metal-containing regions. A pattern defined by the patterned mask may be transferred into the substrate with one or more etches. In some embodiments, the patterning may be utilized to form integrated circuitry, such as, for example, gatelines.

17 Claims, 37 Drawing Sheets

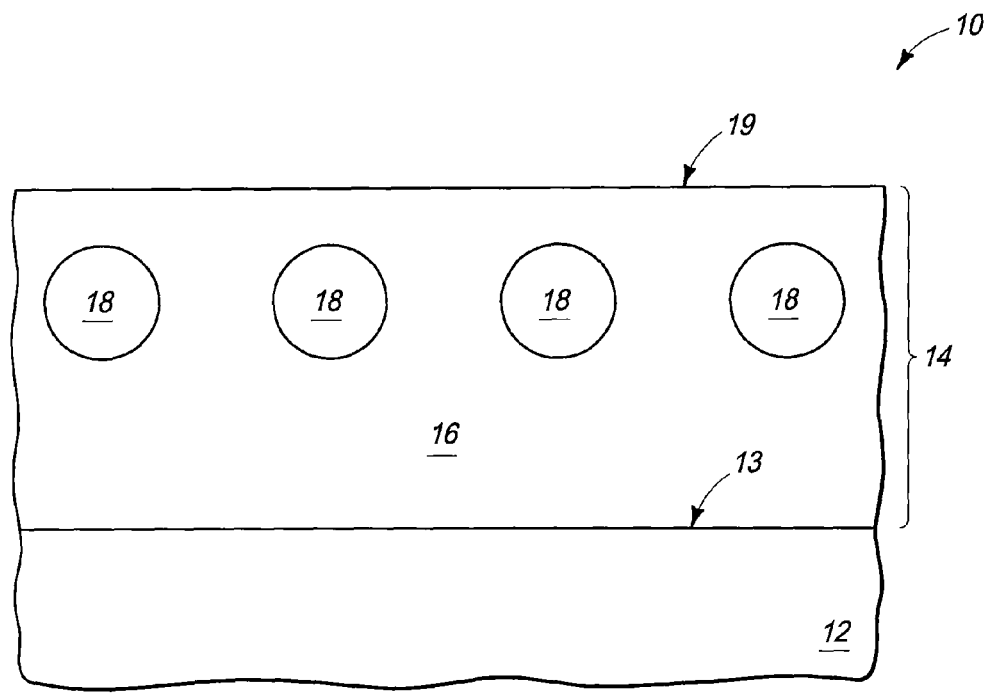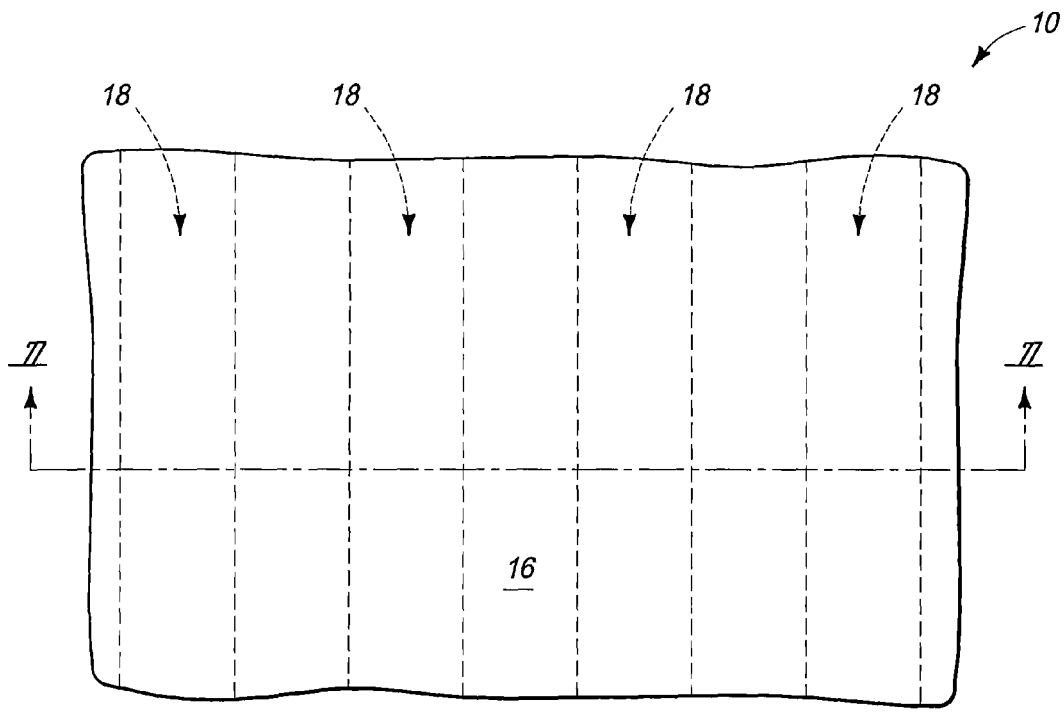

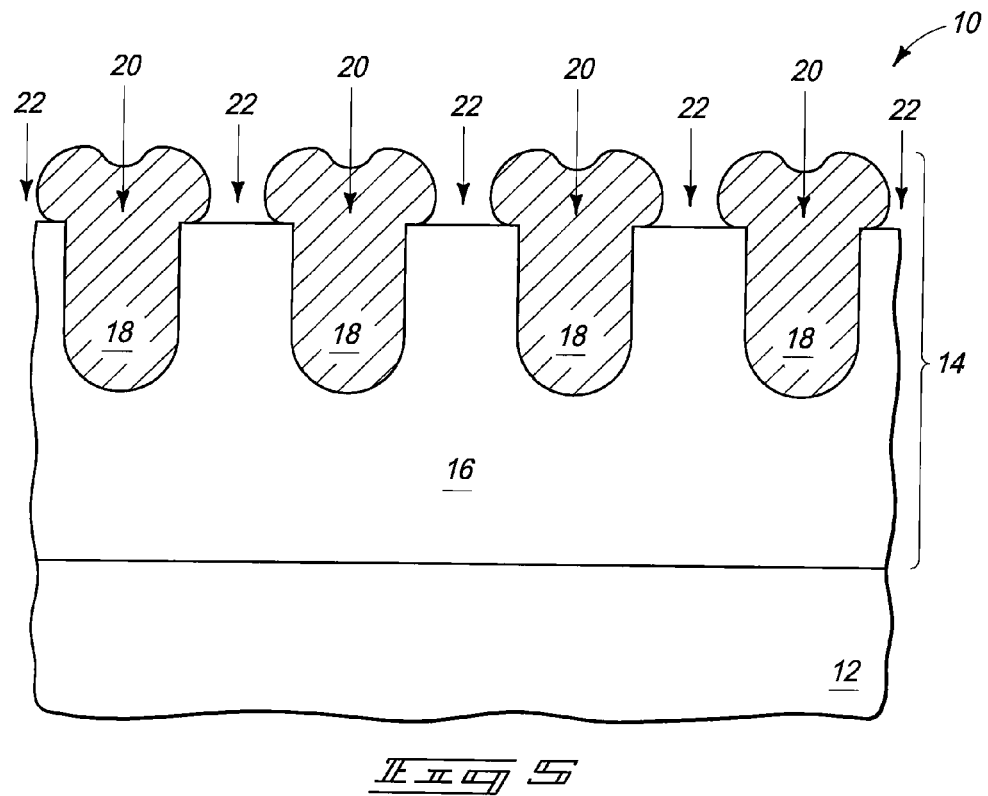
_FIG. 5_
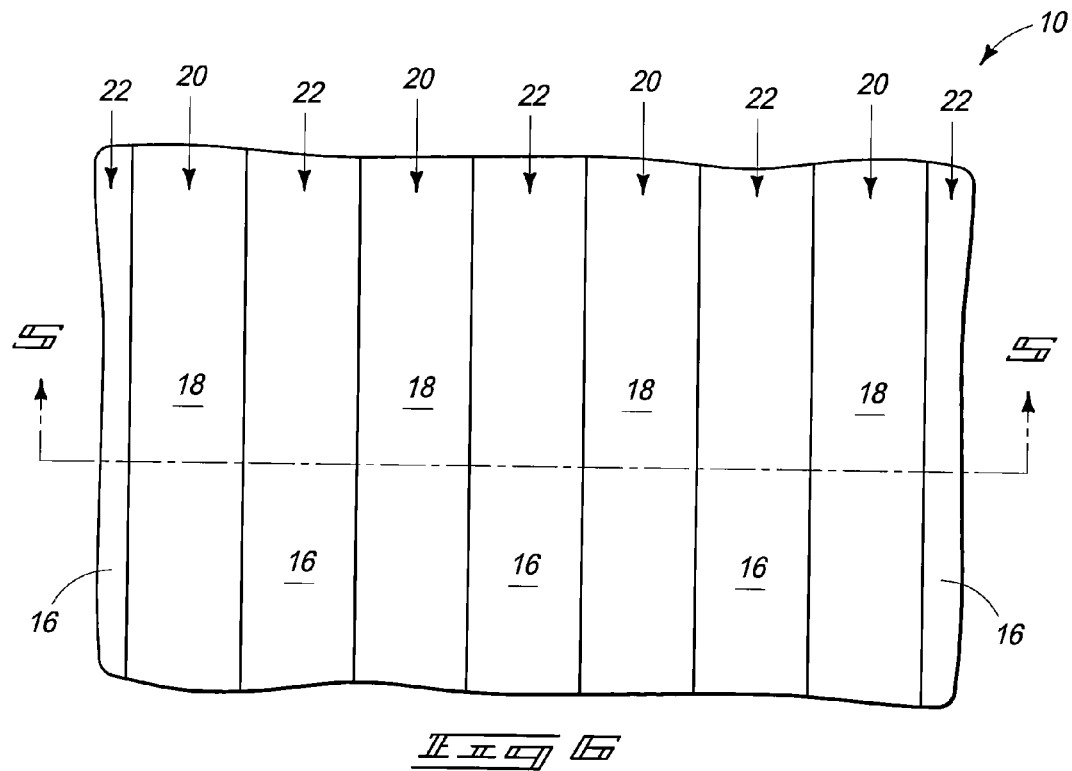
_FIG. 6_

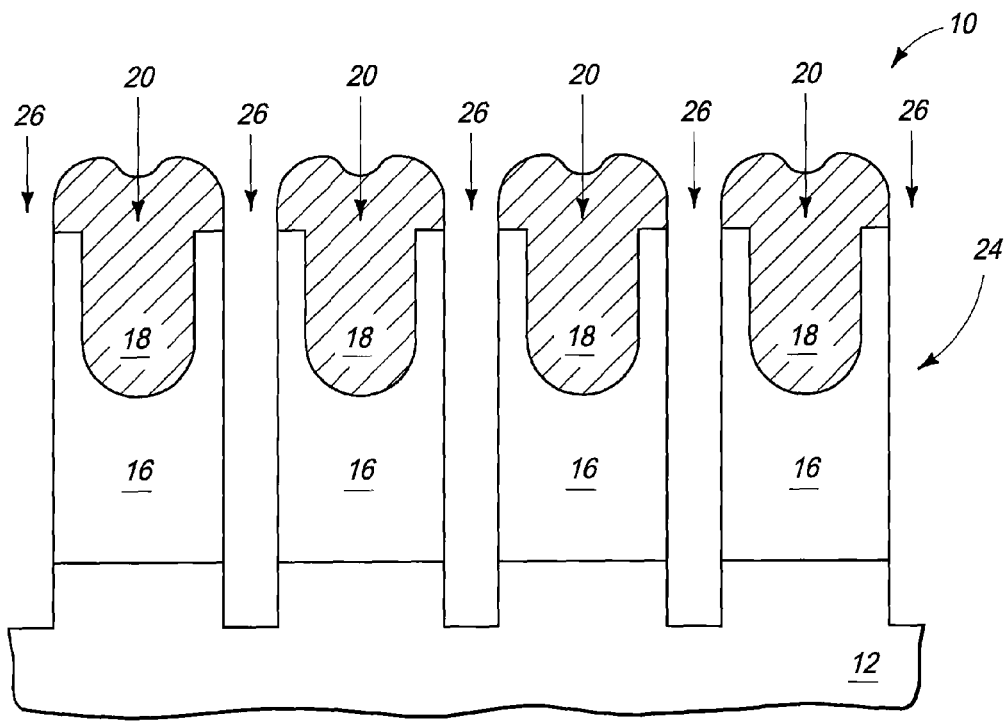
_FIG 9_
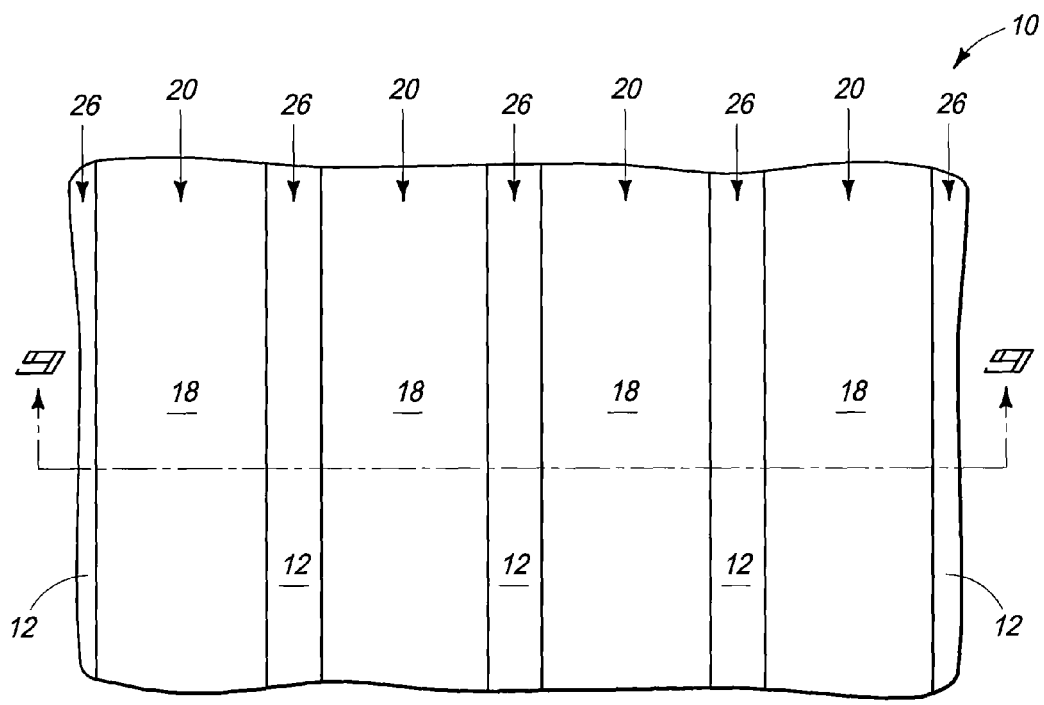
_FIG 10_

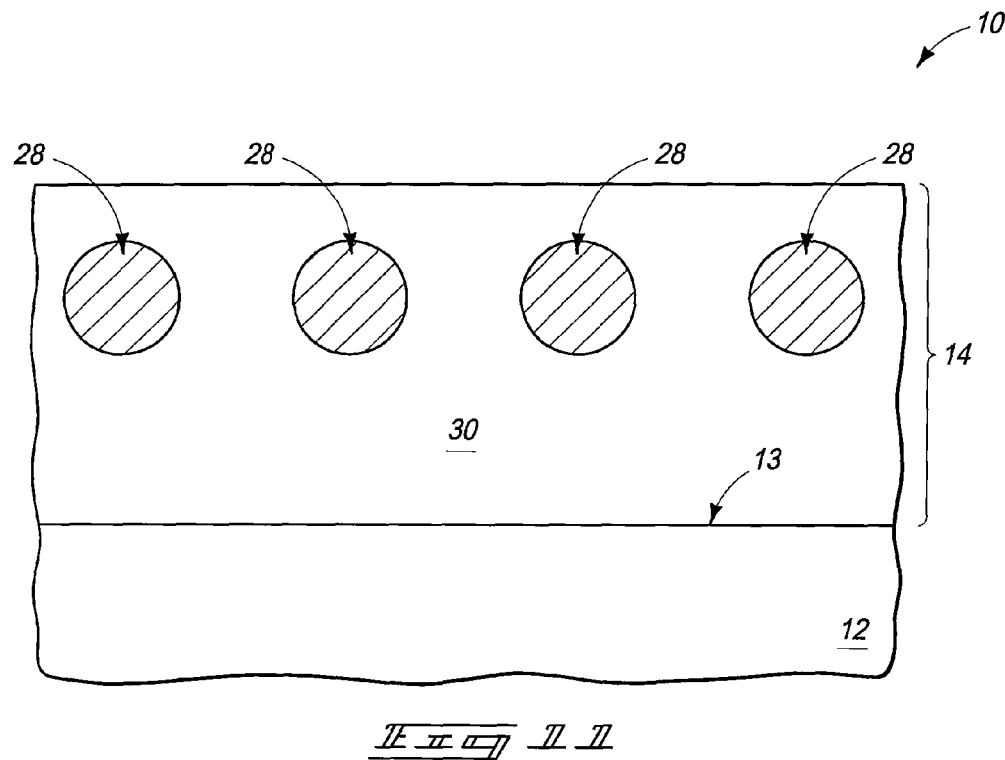
_Fig. 11_
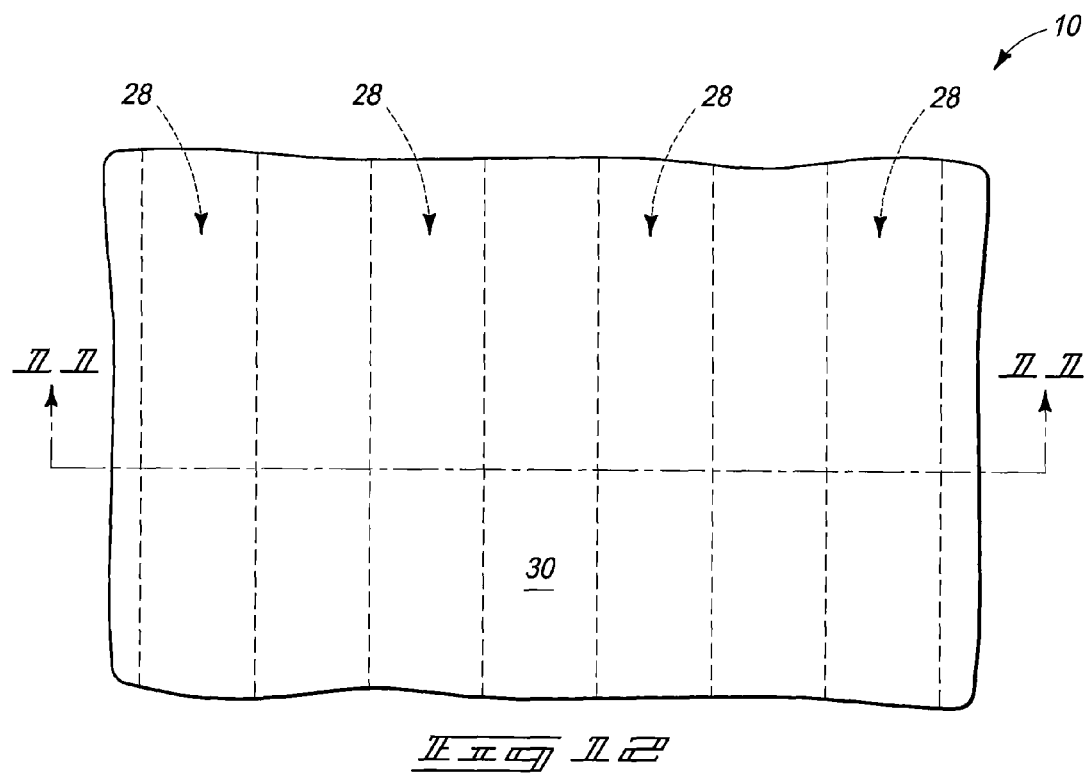
_Fig. 12_

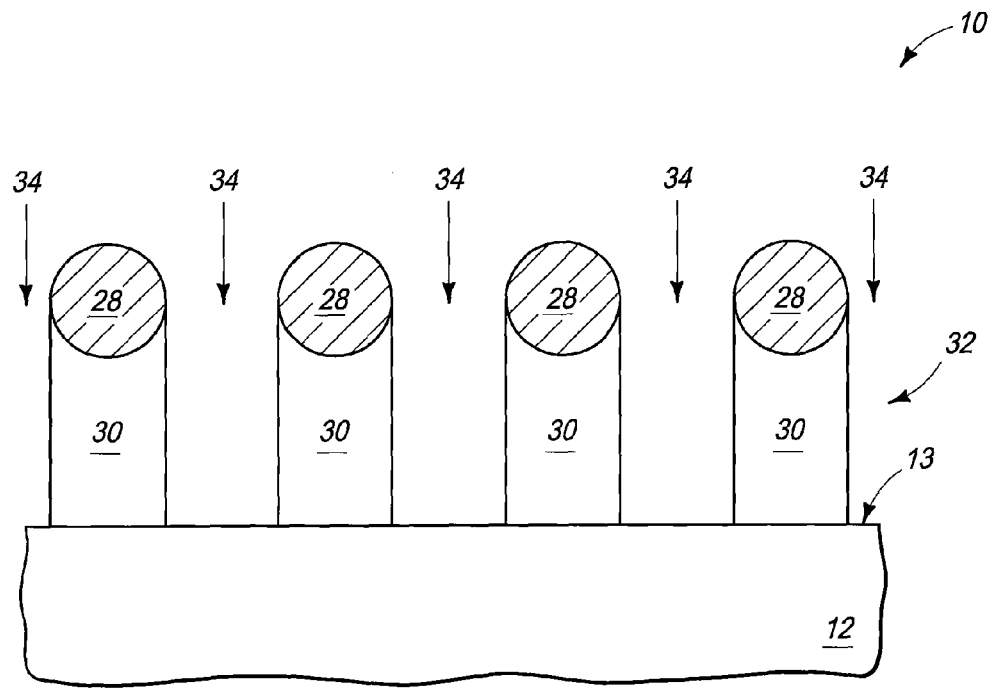
F I G 13
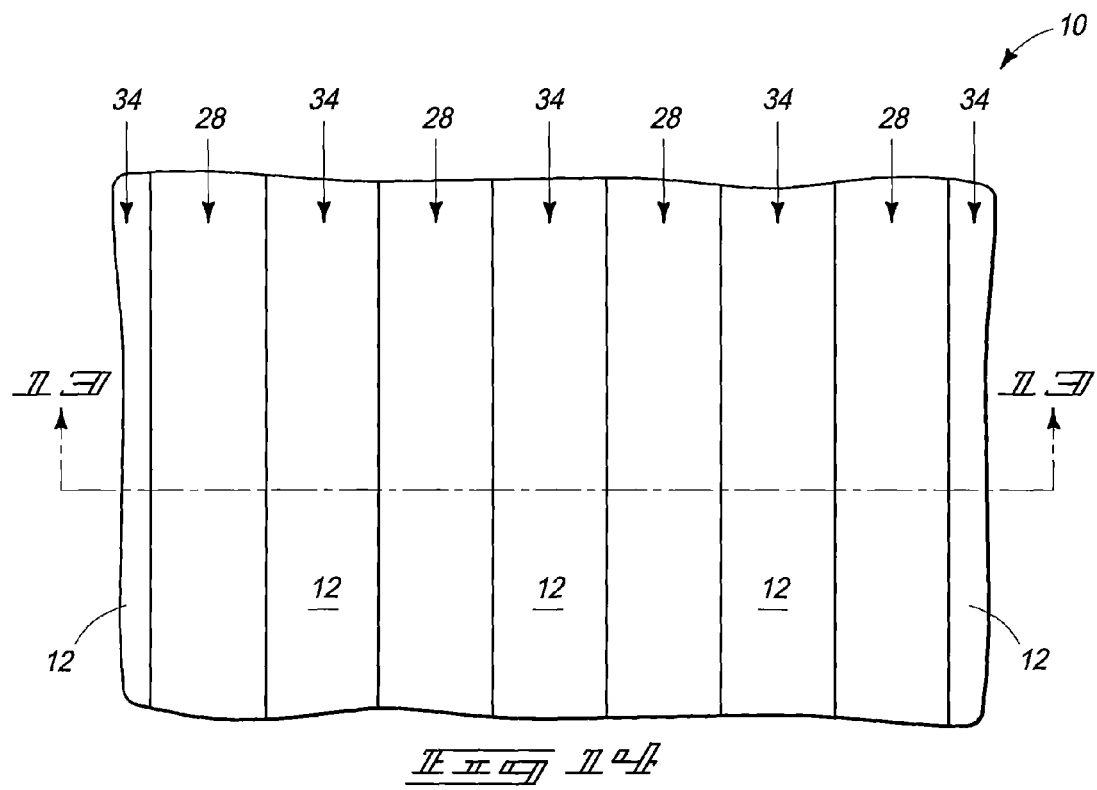
F I G 14

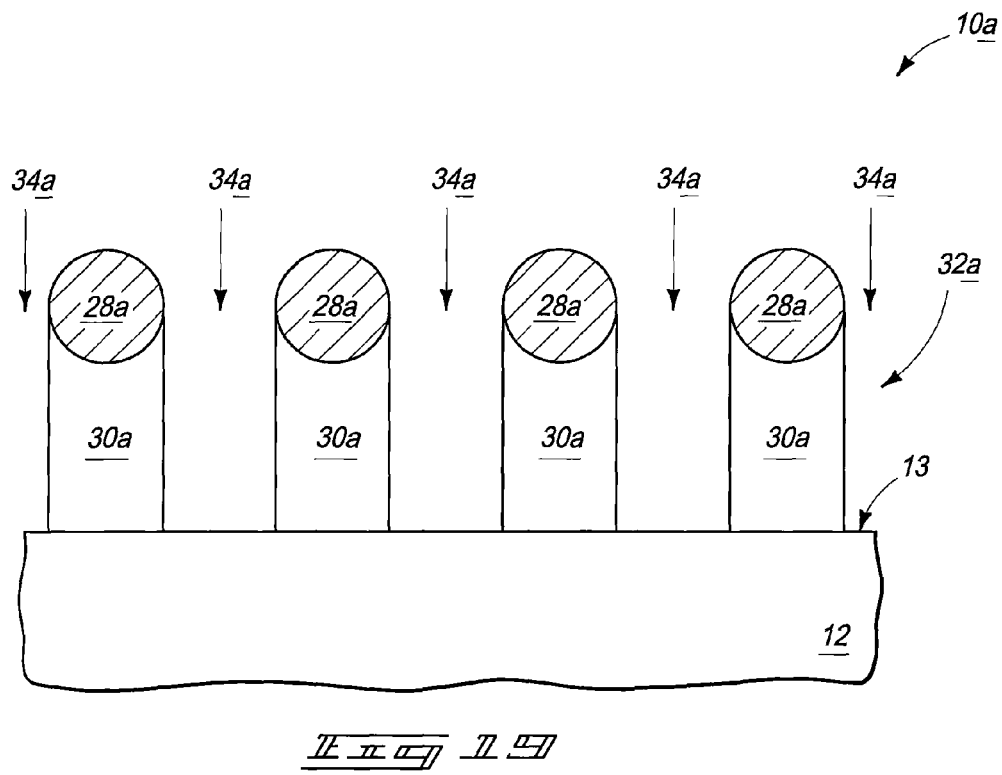
_FIG. 19_
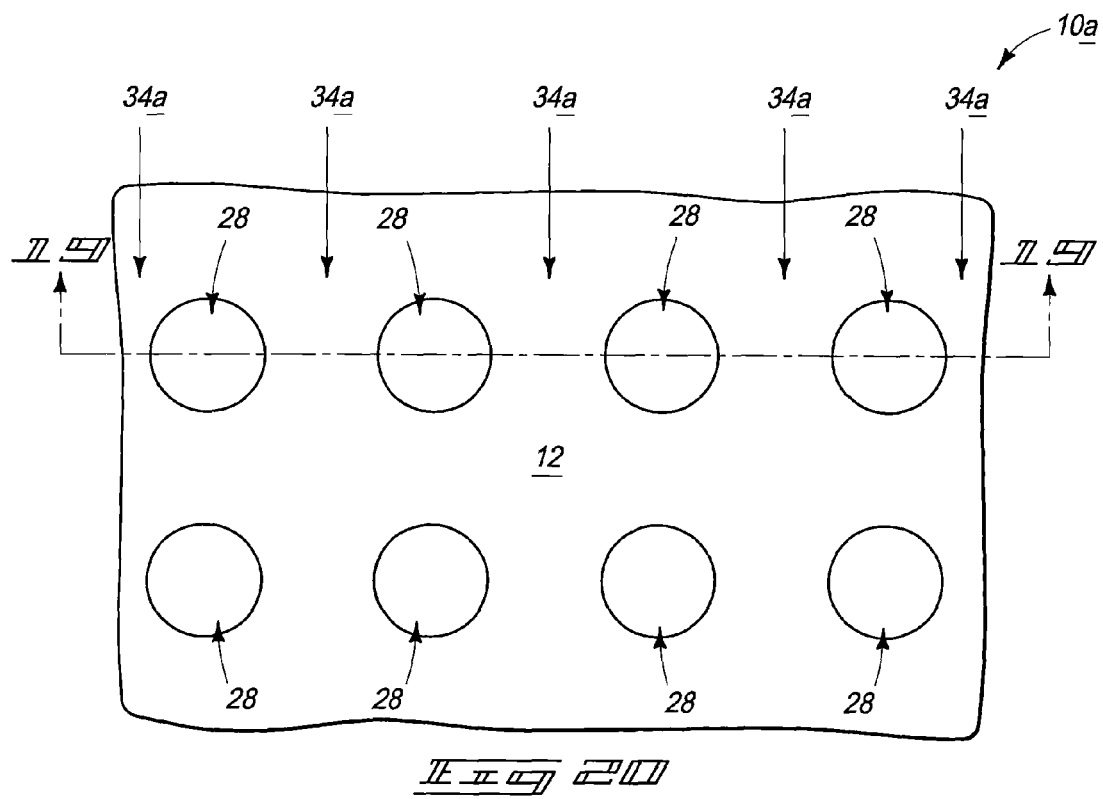
_FIG. 20_

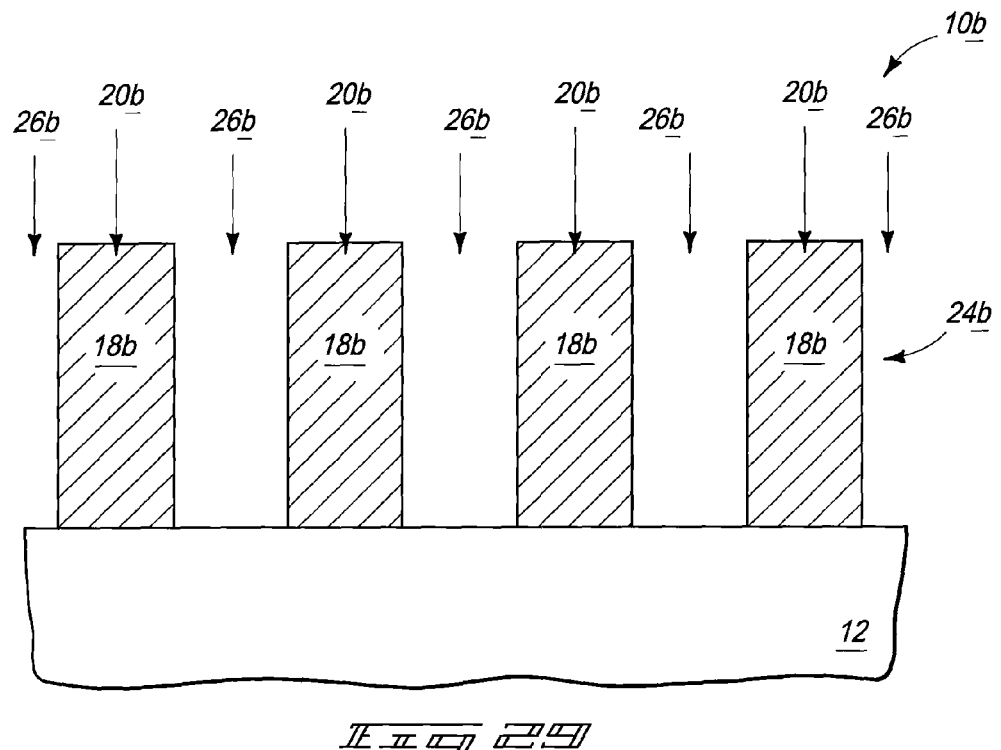
_Fig 29_
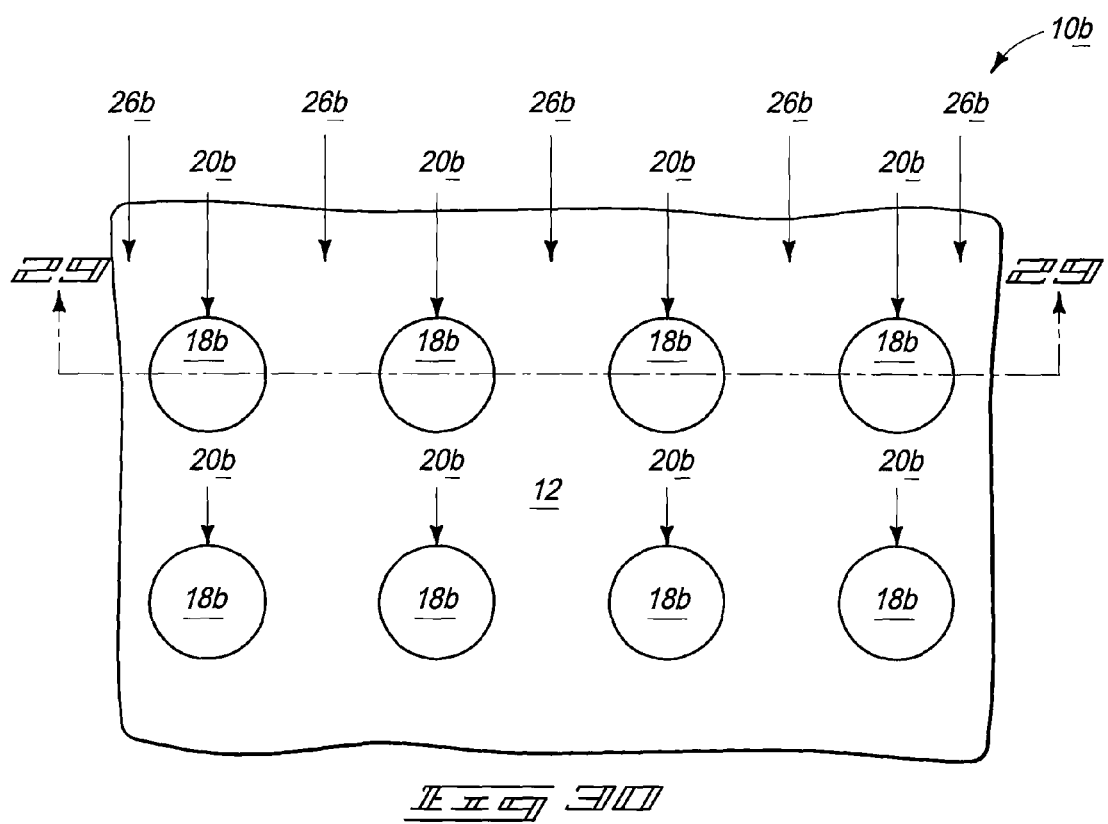
_Fig 30_

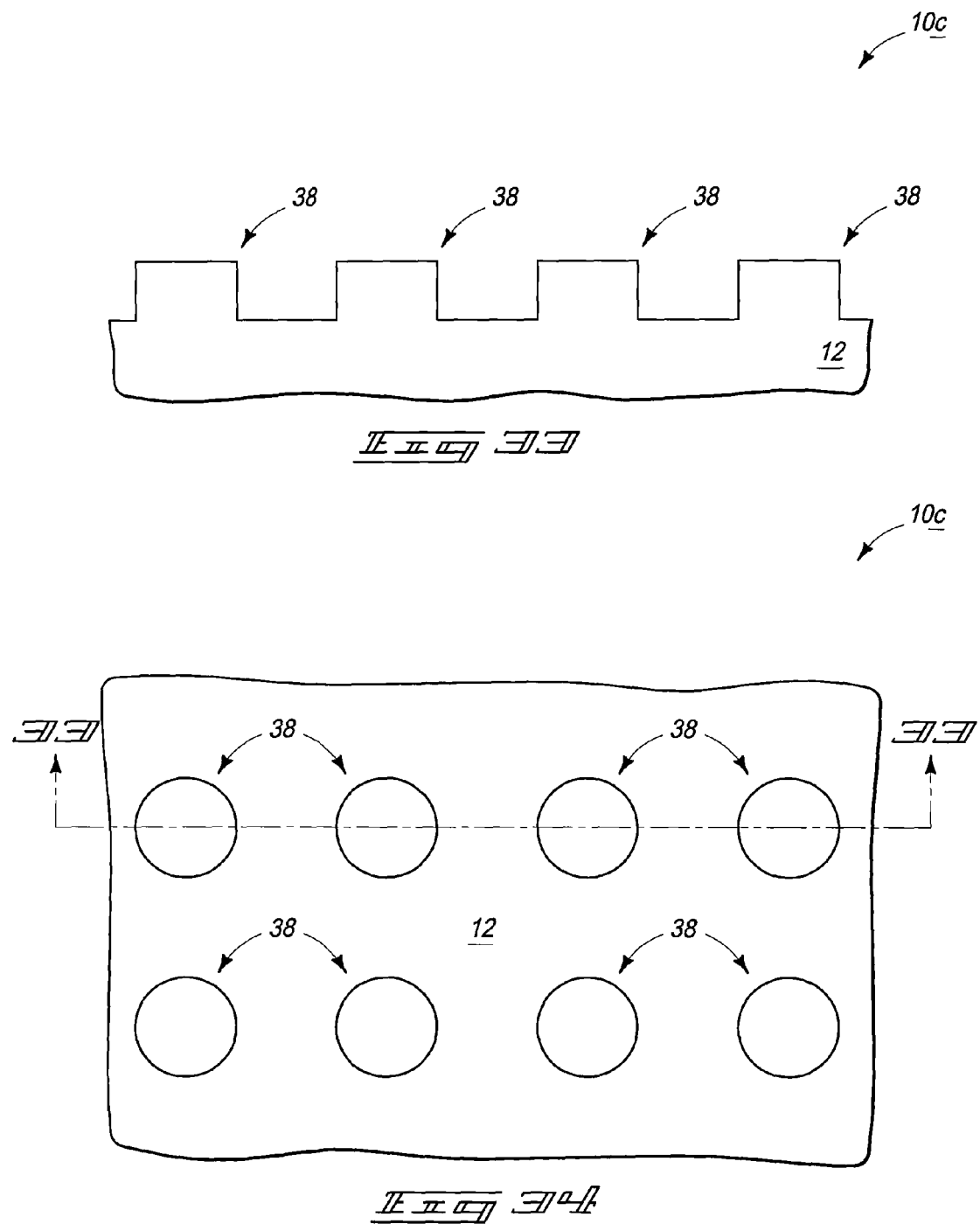

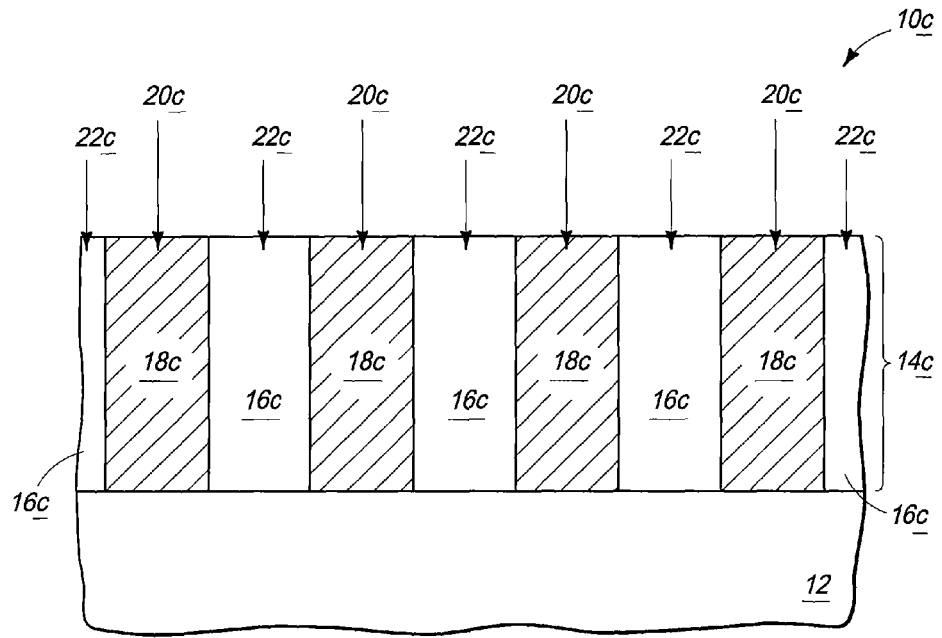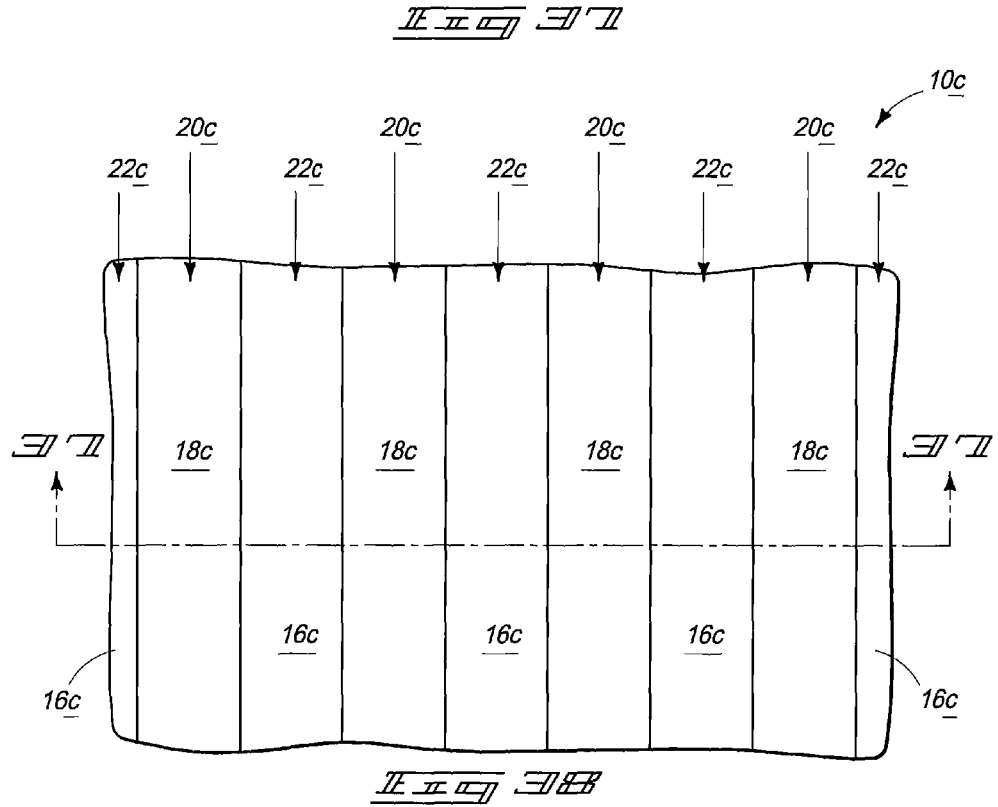

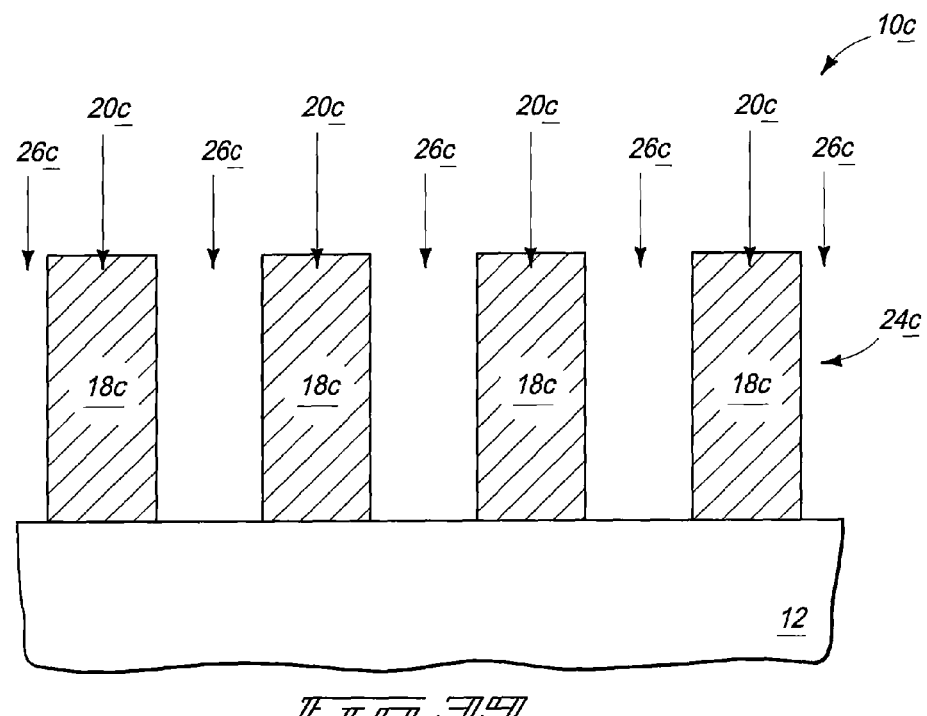
_Fig 39_
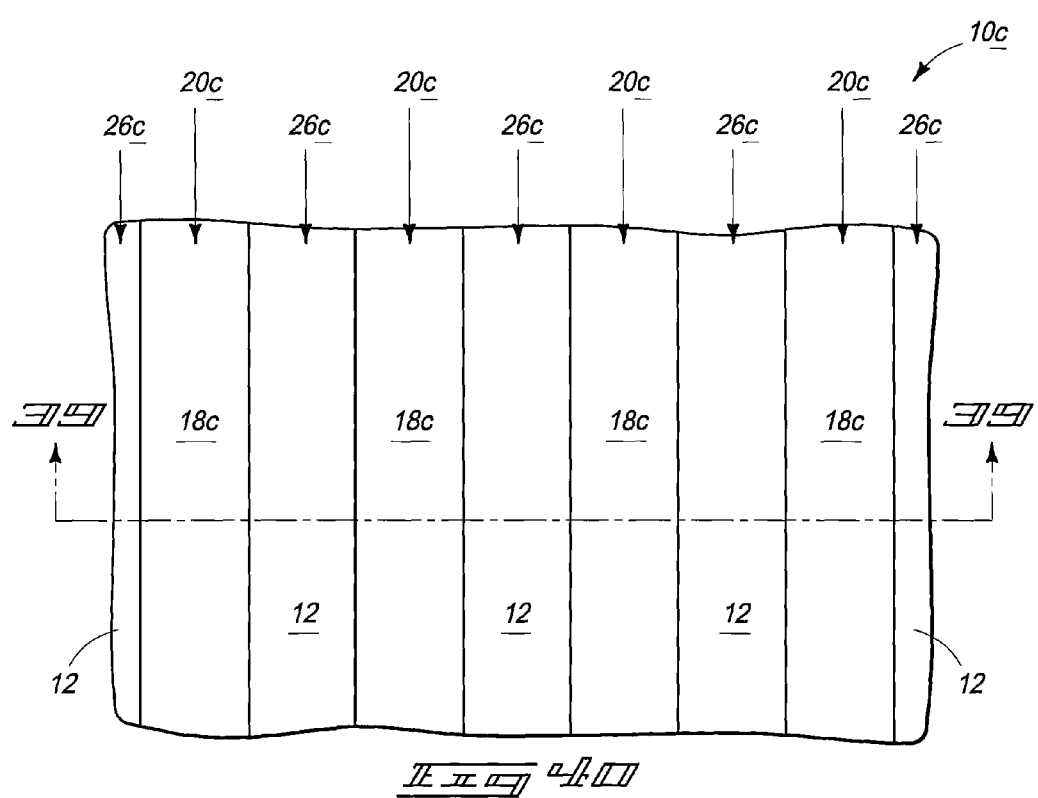
_Fig 40_

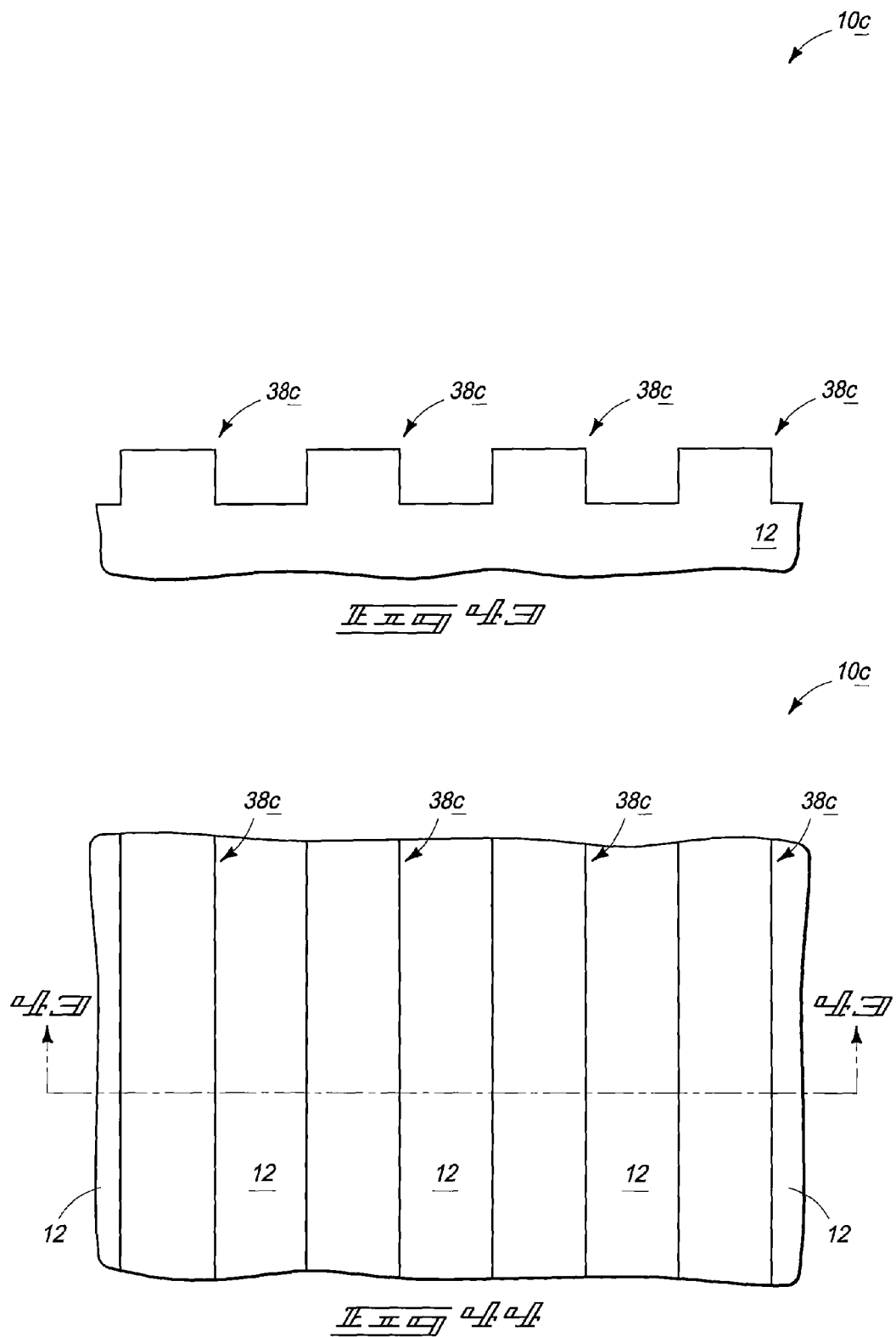

$\mathbb{F}_{I}$ $\mathbb{F}_{I}$ 46

US 8,071,467 B2

METHODS OF FORMING PATTERNS, AND METHODS OF FORMING INTEGRATED CIRCUITS

TECHNICAL FIELD

Methods of forming patterns, and methods of forming integrated circuits.

BACKGROUND

Numerous applications exist in which it is desired to form repeating patterns having a small pitch (for example, a pitch of less than about 50 nanometers). For instance, integrated circuit fabrication may involve formation of a repeating pattern of memory-storage units (e.g., NAND unit cells, dynamic random access memory [DRAM] unit cells, cross-point memory unit cells, etc.).

A variety of methods have been developed for creating patterned masks suitable for patterning underlying materials during fabrication of integrated circuit components. A continuing goal of integrated circuit fabrication is to increase integrated circuit density, and accordingly to decrease the size of individual integrated circuit components. There is thus a continuing goal to form patterned masks having increasing densities of various patterned features.

A method showing some promise for creating repeating patterns to high density involves utilization of block copolymer to form the repeating patterns. Unfortunately, it is difficult to use block copolymer as patterned masks due to various difficulties presented in attempting to selectively remove some portions of block copolymer relative to others to create the patterned masks, and difficulties presented in attempting to transfer patterns from block copolymer masks into underlying materials. It would be desirable to develop new methods of utilizing block copolymer which address and/or circumvent such difficulties.

BRIEF DESCRIPTION OF THE DRAWINGS

FIGS. 1 and 2 are a diagrammatic cross-sectional side view, and a diagrammatic top view, respectively, of a construction at a processing stage of an example embodiment. The cross-sectional view of FIG. 1 is along the line 1-1 of FIG. 2.

FIGS. 5 and 6 are a diagrammatic cross-sectional side view, and a diagrammatic top view, respectively, of the construction of FIGS. 1 and 2 shown at a processing stage subsequent to that of FIGS. 3 and 4. The cross-sectional view of FIG. 5 is along the line 5-5 of FIG. 6.

FIGS. 9 and 10 are a diagrammatic cross-sectional side view, and a diagrammatic top view, respectively, of the construction of FIGS. 1 and 2 shown at a processing stage subsequent to that of FIGS. 7 and 8. The cross-sectional view of FIG. 9 is along the line 9-9 of FIG. 10.

FIGS. 11 and 12 are a diagrammatic cross-sectional side view, and a diagrammatic top view, respectively, of the construction of FIGS. 1 and 2 shown at a processing stage subsequent to that of FIGS. 5 and 6 in accordance with an alternative embodiment to that of FIGS. 7 and 8. The cross-sectional view of FIG. 11 is along the line 11-11 of FIG. 12.

FIGS. 13 and 14 are a diagrammatic cross-sectional side view, and a diagrammatic top view, respectively, of the construction of FIGS. 11 and 12 shown at a processing stage subsequent to that of FIGS. 11 and 12. The cross-sectional view of FIG. 13 is along the line 13-13 of FIG. 14.

FIGS. 19 and 20 are a diagrammatic cross-sectional side view, and a diagrammatic top view, respectively, of the construction of FIGS. 17 and 18 shown at a processing stage subsequent to that of FIGS. 17 and 18. The cross-sectional view of FIG. 19 is along the line 19-19 of FIG. 20.

FIGS. 29 and 30 are a diagrammatic cross-sectional side view, and a diagrammatic top view, respectively, of the construction of FIGS. 25 and 26 shown at a processing stage subsequent to that of FIGS. 27 and 28. The cross-sectional view of FIG. 29 is along the line 29-29 of FIG. 30.

FIGS. 33 and 34 are a diagrammatic cross-sectional side view, and a diagrammatic top view, respectively, of the construction of FIGS. 25 and 26 shown at a processing stage subsequent to that of FIGS. 31 and 32. The cross-sectional view of FIG. 33 is along the line 33-33 of FIG. 34.

FIGS. 37 and 38 are a diagrammatic cross-sectional side view, and a diagrammatic top view, respectively, of the construction of FIGS. 35 and 36 shown at a processing stage subsequent to that of FIGS. 35 and 36. The cross-sectional view of FIG. 37 is along the line 37-37 of FIG. 38.

FIGS. 39 and 40 are a diagrammatic cross-sectional side view, and a diagrammatic top view, respectively, of the construction of FIGS. 35 and 36 shown at a processing stage subsequent to that of FIGS. 37 and 38. The cross-sectional view of FIG. 39 is along the line 39-39 of FIG. 40.

FIGS. 43 and 44 are a diagrammatic cross-sectional side view, and a diagrammatic top view, respectively, of the construction of FIGS. 35 and 36 shown at a processing stage subsequent to that of FIGS. 41 and 42. The cross-sectional view of FIG. 43 is along the line 43-43 of FIG. 44.

DETAILED DESCRIPTION OF THE ILLUSTRATED EMBODIMENTS

Figure 3:
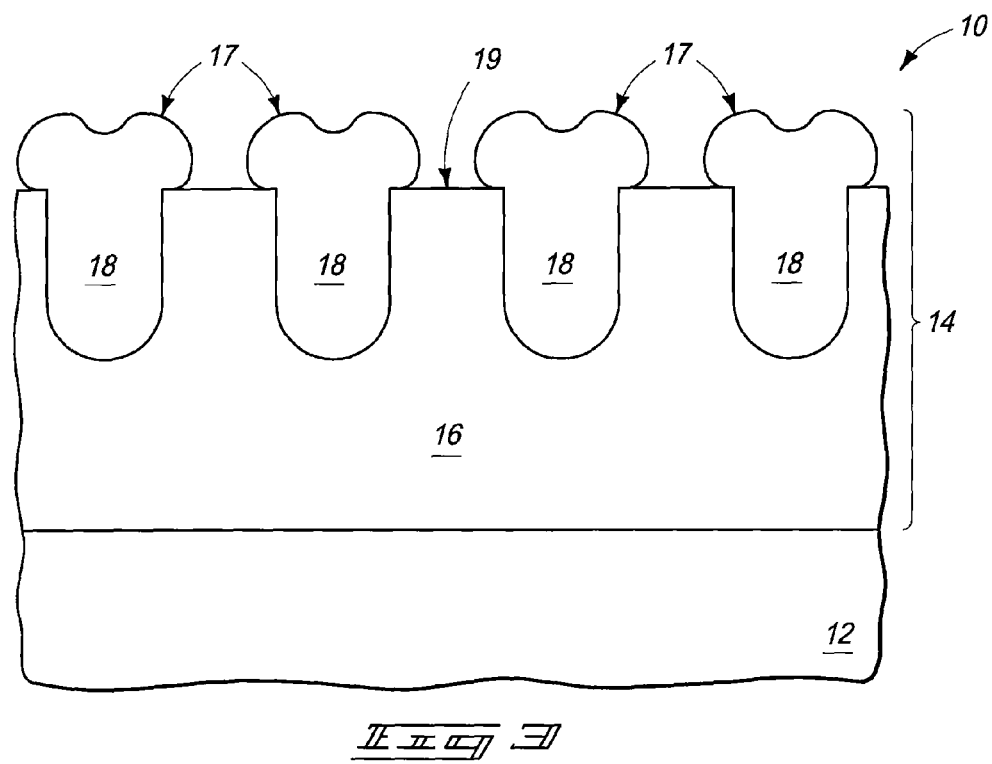
FIGS. 3 and 4 are a diagrammatic cross-sectional side view, and a diagrammatic top view, respectively, of the construction of FIGS. 1 and 2 shown at a processing stage subsequent to that of FIGS. 1 and 2. The cross-sectional view of FIG. 3 is along the line 3-3 of FIG. 4.

Copolymers are polymers derived from two or more monomeric species, and contain two or more homopolymer subunits linked by covalent bonds. The union of the homopolymer subunits may utilize an intermediate linkage, known as a junction block.

The embodiments described herein may utilize block copolymers. Block copolymers may be in the form of diblock copolymers, triblock copolymers, etc. Example diblock copolymers include polystyrene-b-poly (2-vinylpyridine) (PS-b-P2VP); polystyrene-b-poly(ethylene oxide) (PS-b-PEO); polystyrene-b-poly(methylmethacrylate) (PS-b-PMMA); and polystyrene-b-poly(dimethyl-siloxane) (PS-b-PDMS). The "b" utilized in each of the above chemical formulas indicates a block linkage. Other example block copolymers include materials discussed in U.S. Patent Publication No. 2007/0293041.

Diblock copolymers may be generically represented as A-B, where the "A" represents one of the homopolymer subunits, the "B" represents the other of the homopolymer subunits, and the hyphen represents a covalent bond.

A useful property of some block copolymers is that the homopolymer subunits of the copolymers preferentially interact with like subunits, and avoid interactions with dissimilar subunits. For instance, in some diblock copolymers (A-B), the subunits A preferentially interact with other A, the subunits B preferentially interact with other B, and the subunits A and B preferentially avoid interactions with one another; depending on various factors, such as the length of the blocks, the overall volume fraction of each block, Flory-Huggins interactions, etc. The copolymers may thus self-assemble into repeating patterns. For instance, some diblock copolymers may self-assemble into a repeating pattern that may be represented as A-B:B-A:A-B:B-A:A-B. In such pattern, the hyphens represent covalent bonds and the colons represent non-covalent interactions. The self-assembly of copolymers may be utilized to form patterns over substrates.

Block copolymers may be utilized to form patterns of repeating nanoscale structures. For instance, one of the subunits A or B of the above-described repeating pattern represented as A-B:B-A:A-B:B-A:A-B may form a matrix, and the other of the subunits may form nanoscale structures dispersed throughout such matrix in a repeating pattern. The matrix may be considered to be a first domain, and the repeating nanoscale structures may be considered to be a second domain. It would be desirable to utilize the nanoscale structures of block copolymer patterns as patterned masks in the fabrication of integrated circuitry. For instance, it would be desirable to selectively remove one of the first and second domains selectively relative to the other to form a patterned mask. The patterned mask could then be used to define a pattern that could be transferred into an underlying material with a suitable etch.

Unfortunately, selective etches tend to be specific for particular classes of materials (for instance, organic materials may be selectively etched relative to silicon dioxide), rather than for materials within the same class as one another. Since the A and B subunits are often both within the same class (specifically, both are typically organic polymers), it is difficult to selectively remove one of the subunits relative to the other.

Although the A and B subunits tend to be too similar to be readily differentiated from one another by conventional etch chemistries, differences between the A and B subunits can be exploited by different chemistries. For instance, the A and B subunits may have different affinities for various metals due to chemical differences between the subunits. Specifically, heterogeneous (i.e., non-carbon) atoms, such as nitrogen, oxygen, sulfur, etc., may be incorporated into organic molecules to enhance coupling to metals. As another example, some subunits may contain species (for instance, amines and carboxylic acids) that can be changed from an electrically neutral state to an electrically charged state by a change in pH, and then the electrically charged state may couple to metals, or metal-containing compounds, through coulombic interactions. As yet another example, some organic groups contain π-orbital electrons that may be utilized in coupling to metals. Some methods for selectively coupling metals to particular subunits of block copolymers are described in Chai et. al., Nature Nanotechnology, Vol. 2, pp 590-596 (2007); Park et. al., Nano Letters, Vol. 8, No. 6, pp 1667-1672 (2008); and Chai et. al., ACS Nano Vol. 2, No. 3, pp 489-501 (2008).

Some embodiments comprise selectively coupling metal to one of the domains of patterned block copolymer relative to another domain, and then the utilizing the metal as a mask during subsequent patterning of an underlying material. The metal may be in any suitable form, and may be, for example, in elemental form (such as elemental gold, titanium, platinum, ruthenium, tungsten, etc.), or part of a metal-containing compound (such as a platinum chloride salt, a silver chloride salt, a palladium chloride salt, an iron cyanide salt, a cobalt cyanide salt, a copper halide salt, a nickel halide salt, titanium oxide, silicon dioxide, etc.).

For purposes of interpreting this disclosure and the claims that follow, the term "metal" means any of alkali metals (i.e., metals from Group 1 of the periodic table), alkaline earth metals (i.e., metals from Group 2 of the periodic table), inner transition elements (i.e., any of the lanthanides and actinides), transition elements (i.e., metals from groups 3-12 of the periodic table), metals of groups 13-15 of the periodic table (i.e., Al, Ga, In, Sn, Bi, etc.) and metalloids of groups 13-16 of the periodic table (i.e., Si, Ge, As, Sb, Te, Po, etc.).

Figure 63:
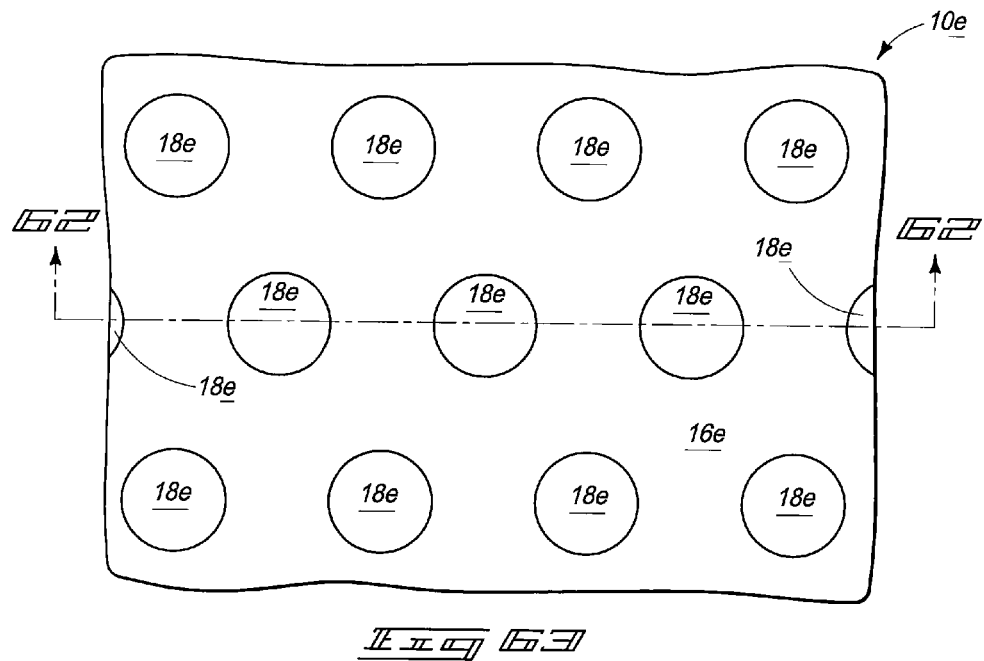

Example embodiments are described with reference to FIGS. 1-63.

Referring to FIGS. 1 and 2, a construction 10 is shown to comprise a block copolymer assembly 14 formed over a substrate 12.

In some embodiments, the substrate 12 may correspond to a semiconductor base. Such base may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although substrate 12 is shown to be homogenous, the substrate may comprise numerous layers in some embodiments. For instance, substrate 12 may correspond to a semiconductor substrate containing one or more layers associated with integrated circuit fabrication. In such embodiments, such layers may correspond to one or more of refractory metal layers, barrier layers, diffusion layers, insulator layers, etc.

The block copolymer assembly 14 is arranged in a pattern comprising two different domains; with one of the domains corresponding to a matrix 16, and the other of the domains corresponding to features 18 entirely contained within such matrix. The block copolymer assembly 14 has an upper surface 19 entirely composed of the matrix domain 16 at the processing stage of FIGS. 1 and 2. In the shown embodiment, substrate 12 has a planar upper surface 13, and the features 18 are cylinders that extend linearly along a direction parallel to such planar surface (as shown in the top view of FIG. 2, with the features 18 being shown in dashed-line view to indicate that such features are beneath the upper surface of matrix 16).

The block copolymer may be formed into the shown assembly by a two-step process in which block copolymer is first spread across the upper surface 13 of substrate 12, and then treated to induce self-assembly of a pattern within the copolymer (the treatment may utilize any suitable process such as, for example, a thermal anneal, a solvent anneal, and/or a process yet to be developed).

In the embodiment of FIGS. 1 and 2, the block copolymer comprises at least two different subunits, and the self-assembly has caused some of the subunits to be incorporated into features 18, while others of the subunits become the matrix 16. For instance, the block copolymer may be PS-b-P2VP, and in such embodiments the features 18 may correspond to poly-2 vinyl pyridine (P2VP) while the matrix corresponds to polystyrene (PS). In some embodiments, the subunits that incorporate into features 18 may be referred to as first subunits, while those that incorporate into matrix 16 are referred to as second subunits.

Figure 4:
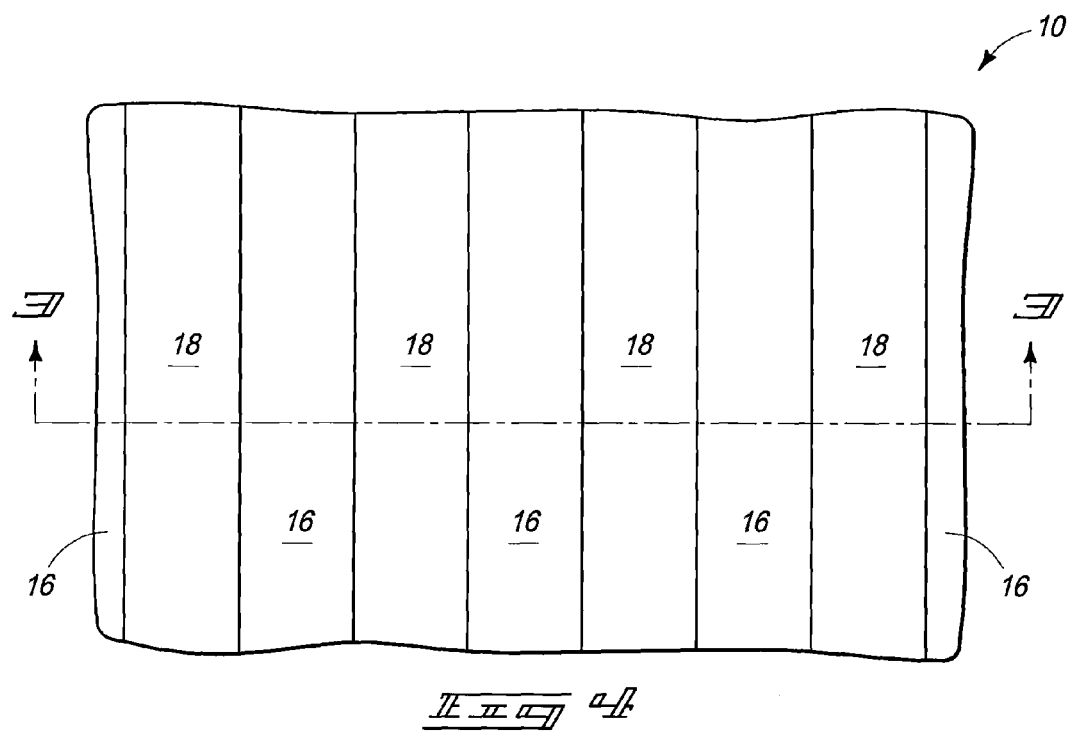

Referring to FIGS. 3 and 4, block copolymer assembly 14 is exposed to conditions that disrupt features 18, and cause the features to extrude through matrix 16 (i.e., that lead to rupture of the matrix domain with extrusion of portions of the minority domain of features 18 to the free surface) so that the upper surface of the block copolymer assembly now comprises both the first subunits of features 18 and the second subunits of matrix 16. The extrusion of features 16 through matrix 18 may be referred to as mushrooming analogously to a description utilized in Chai et. al. ACS Nano Vol. 2, No. 3, pp 489-501 (2008), or may be referred to as blooming or swelling.

The extrusion of features 16 through matrix 18 may be induced utilizing any suitable conditions. For instance, if features 18 comprise P2VP, the extrusion may be induced by exposing assembly 14 to acid. The acid can protonate pyridine of the P2VP and thereby cause the P2VP to swell, analogously to a process described in Chai et. al., ACS Nano Vol. 2, No. 3, pp 489-501 (2008). Alternatively, the extrusion of features 18 through the matrix 16 of block copolymer assembly 14 may induced by exposing the assembly to base in embodiments in which features 18 contain carboxylic acids, thiols, or other groups that may be deprotonated to form charged species. In some embodiments, the extrusion of features 18 through the matrix 16 of block copolymer assembly 14 may be induced by exposing the assembly to a substance that attracts the first subunits of features 18 selectively relative to the second subunits of matrix 16. Such substance may be a solvent that selectively solvates the first subunits relative to the second subunits. The solvent can attract the first subunits of features 18 to disrupt the features and cause the shown extrusion, but cannot fully solvate the first subunits due to the first subunits being tethered to the second subunits of the block copolymer.

Referring to FIGS. 5 and 6, construction 10 is exposed to metal, and the metal selectively couples to the first subunits of features 18 relative to the second subunits of matrix 16. The features 18 having metal incorporated therein become metal-containing regions 20, while the matrix 16 is a non-metal-containing region 22. In other embodiments, the metal may be selectively coupled to the second subunits of matrix 16 relative to the first subunits of features 18. Regardless, a pattern of metal-containing regions and non-metal-containing regions is formed by the selective coupling of metal to some of the subunits relative to others of the subunits. The process of coupling metal to some of the subunits may be referred to as "staining" of the subunits.

The metal may be in elemental form, or may be part of a metal-containing compound. If the metal is in elemental form, it may be coupled to subunits of the block copolymer through chelation and/or other appropriate ligand interactions. For instance, the subunits may be configured to comprise unsaturated organic groups (i.e., organic groups having π-orbital electrons), nitrogen, sulfur, and/or oxygen in appropriate spacings and orientations to coordinate with metal. If the metal is part of a metal-containing compound, such compound may also be retained with appropriate ligand interactions and/or may be retained with coulombic interactions. The coulombic interactions may be utilized by providing a charge on a subunit opposite to a charge of the metal-containing compound. For instance, a subunit may comprise pyridine, and may be protonated to have a positive charge; and a metal-containing compound may be provided which has a negative charge, analogously to processes disclosed in Chai et. al., ACS Nano Vol. 2, No. 3, pp 489-501 (2008). As another example, a subunit may comprise a carboxylic acid, and may be deprotonated to have a negative charge; and a metal-containing compound may be provided which has a positive charge.

Any suitable metal or metal-containing compound may be utilized. In some embodiments, the metal may be selected from the group consisting of silicon, germanium, ruthenium, cobalt, nickel, titanium, tungsten, palladium, gold, copper, silver and iron. In some embodiments, a metal-containing compound may comprise metal halide, metal cyanide, metal nitride and/or metal oxide. For instance, a metal-containing compound may comprise silicon dioxide, titanium oxide, or any of the various compounds described in Chai et. al. ACS Nano Vol. 2, No. 3, pp 489-501 (2008).

Figure 7:
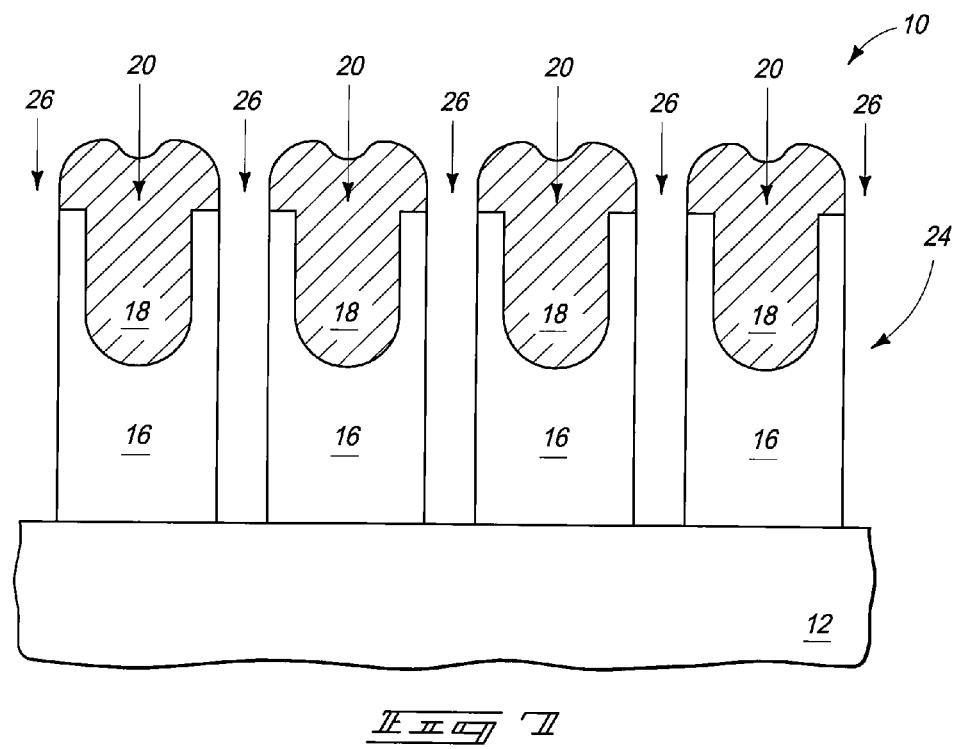
FIGS. 7 and 8 are a diagrammatic cross-sectional side view, and a diagrammatic top view, respectively, of the construction of FIGS. 1 and 2 shown at a processing stage subsequent to that of FIGS. 5 and 6. The cross-sectional view of FIG. 7 is along the line 7-7 of FIG. 8.
Figure 8:
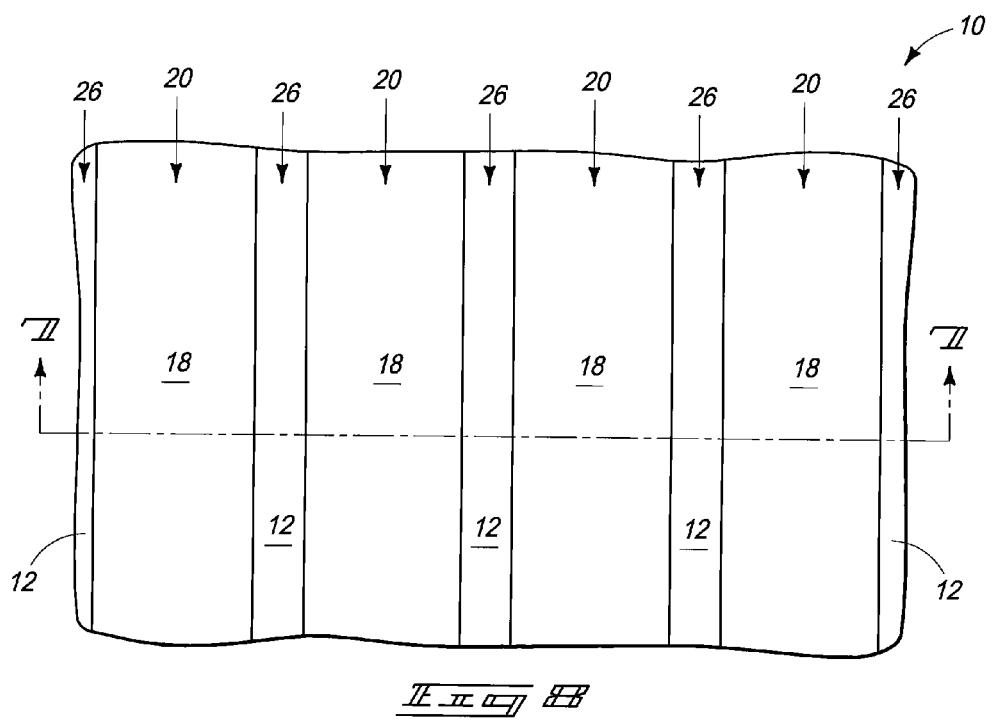

Referring to FIGS. 7 and 8, some of the block copolymer is removed selectively relative to metal-containing regions 20 to form a patterned mask 24 containing metal from the metal-containing regions 20; with such metal-containing regions being spaced from one another by gaps 26. The block copolymer is removed with an anisotropic etch. Such etch may utilize any suitable conditions and chemistries for removing block copolymer from between metal-containing regions 20. For instance, the etch may utilize plasma and oxidant (for instance, $O_2$) to selectively remove organic materials relative to metal.

Referring to FIGS. 9 and 10, the pattern defined by patterned mask 24 is transferred into substrate 12 by extending gaps 26 into the substrate with one or more suitable etches. The substrate may comprise any of numerous materials, such as, for example, semiconductor materials, dielectric materials and electrically conductive materials. The etch chemistry may be any chemistry suitable to etch into and/or through specific materials of the substrate. For instance, in some embodiments the substrate may comprise a layer of silicon dioxide which is to be etched, and the etch chemistry may utilize one or more fluorocarbons. Some example materials and constructions that may be comprised by substrate 12 are described below with reference to FIGS. 45-59.

The patterned mask 24 of FIGS. 9 and 10 may be removed from over substrate 12 in subsequent processing (not shown). Alternatively, the patterned mask may be left over substrate 12 to be incorporated into integrated circuit structures.

FIGS. 7 and 8 show removal of block copolymer occurring while metal-containing regions 20 are within mushroom-shaped metal-containing features 18. In other embodiments the block copolymer of FIGS. 5 and 6 may be subjected to conditions which cause the metal-containing features 18 to redistribute within matrix 16 so that the metal-containing features reconfigure as features entirely contained within the matrix. An example embodiment process utilizing metal-containing features reconfigured to be entirely contained within a matrix is described with reference to FIGS. 11-24. Identical numbering will be utilized to describe FIGS. 11-24 as is utilized above in describing FIGS. 1-10, where appropriate.

Referring to FIGS. 11 and 12, construction 10 is shown at a processing stage subsequent to that of FIGS. 5 and 6. The transformation of features 20 of FIGS. 5 and 6 into features 28 of FIGS. 11 and 12 is induced by exposure of block copolymer 14 to conditions which cause the block copolymer to redistribute such that metal-containing subunits migrate from a surface of the block copolymer into internal features (i.e., into the features 28 that are entirely contained within the matrix 30). In some embodiments, the metal-containing features 28 may be referred to as second features to distinguish them from the first features 18 present at the processing stage of FIGS. 1 and 2; and similarly matrix 30 may be referred to as a second matrix to distinguish it from the first matrix 16 present at the processing stage of FIGS. 1 and 2.

The conditions utilized to form metal-containing features 28 of FIGS. 11 and 12 from the features 20 of FIGS. 5 and 6 may be any suitable conditions, and in some embodiments may comprise a thermal anneal, a solvent anneal and/or conditions similar to those described in Park et. al., Nano Letters, Vol. 8, No. 6, pp 1667-1672 (2008) as "surface reconstruction" conditions. In some embodiments, the conditions utilized to induce formation of features 28 (FIGS. 11 and 12) from features 20 (FIGS. 5 and 6) may be referred to as a post-stain anneal.

In some embodiments, the conditions utilized to form metal-containing features 28 may be referred to as second conditions, and the conditions described above with reference to FIGS. 3 and 4 for disrupting regions 18 may be referred to as first conditions. In such embodiments, the first conditions may be considered to induce disruption and extrusion of block copolymer minority domains (features 18) through a matrix domain, and the second conditions may be considered to induce reabsorption of the block copolymer minority domains (shown as features 28) within the matrix domain.

The features 28 of FIGS. 11 and 12 are similar to the features 18 of FIGS. 1 and 2, and correspond to cylinders extending within matrix 30 and parallel to upper surface 13 of substrate 12. In other embodiments, the features formed by reabsorption of metal-containing block copolymer domains into a matrix may be different from the features present at the processing stage of FIGS. 1 and 2.

The metal-containing features 28 may be utilized to form a patterned mask with processing analogous to that of FIGS. 6-10. FIGS. 13 and 14 show construction 10 at a processing stage subsequent to that of FIGS. 11 and 12, and specifically after an anisotropic etch has been utilized to move some of the block copolymer selectively relative to metal-containing regions 28 and thereby form a patterned mask 32 containing metal from the metal-containing features 28. The metal-containing features of such patterned mask are spaced from one another by gaps 34. The anisotropic etch may utilize any suitable conditions and chemistries, and may, for example, utilize conditions analogous to those discussed above with reference to FIGS. 7 and 8.

Figure 15:
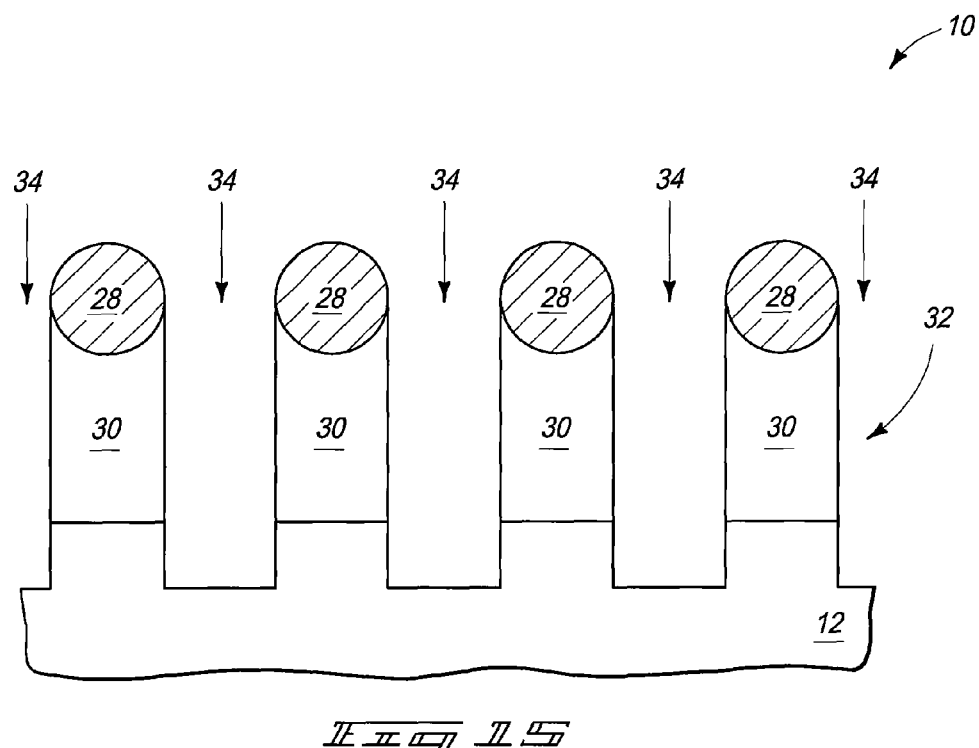
FIGS. 15 and 16 are a diagrammatic cross-sectional side view, and a diagrammatic top view, respectively, of the construction of FIGS. 11 and 12 shown at a processing stage subsequent to that of FIGS. 13 and 14. The cross-sectional view of FIG. 15 is along the line 15-15 of FIG. 16.
Figure 16:
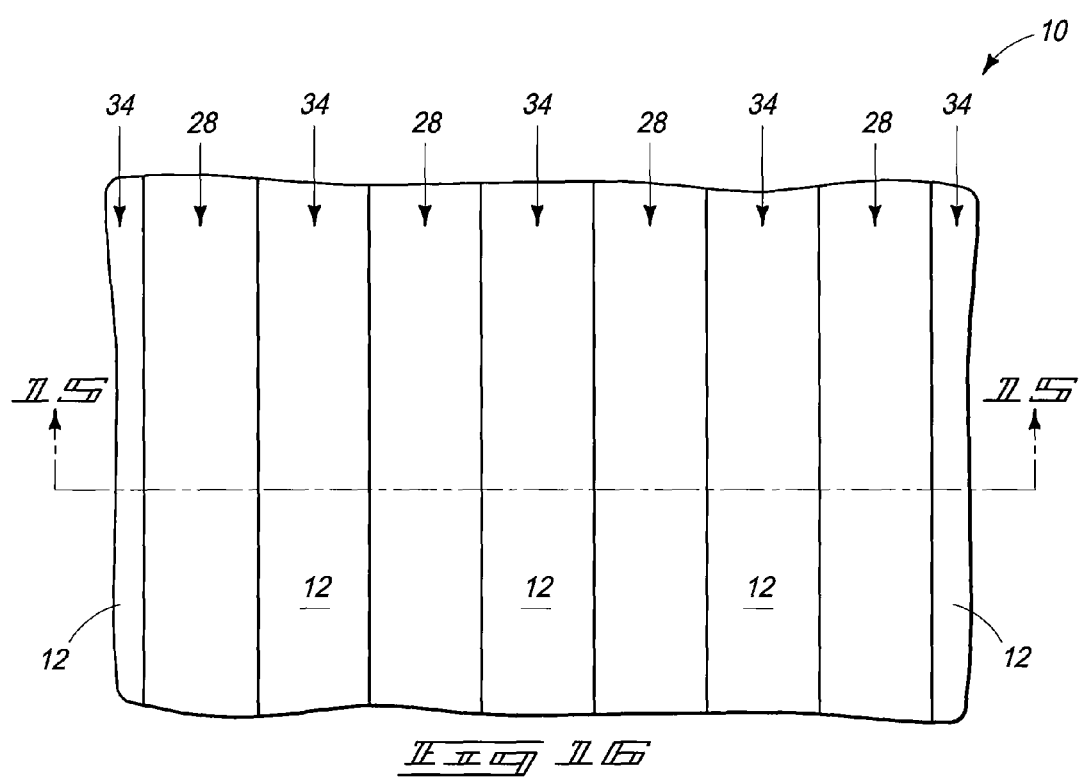

Referring to FIGS. 15 and 16, the pattern defined by patterned mask 32 is transferred into substrate 12 by extending gaps 34 into the substrate with one or more suitable etches. The substrate may comprise any of various materials, as discussed above with reference to FIGS. 9 and 10, and the etch chemistry may be any chemistry suitable to etch into and/or through specific materials of the substrate. In subsequent processing, patterned mask 32 may be removed. Alternatively, the patterned mask may be left over substrate 12 to be incorporated into integrated circuit structures.

In some embodiments, it may be advantageous to utilize the redistribution of metal-containing regions described with reference to FIGS. 11 and 12 for forming a mask, rather than using the mushroomed structures of FIGS. 5 and 6 as a mask. Specifically, it is found that in some applications the masks formed utilizing redistributed regions of the type described with reference to FIGS. 11 and 12 will have more etch resistant features than do masks formed using the mushroomed structures of FIGS. 5 and 6. The more etch resistant features can be advantageous if subsequent etches conducted while using the mask to define a pattern have some propensity to etch the masking features, in that the more etch resistant features will last longer under such etching conditions than would less etch resistant features. However, masks formed utilizing the mushroomed structures of FIGS. 5 and 6 may be advantageous over masks comprising redistributed metal-containing regions in some embodiments, such as when subsequent etching conditions will not significantly affect masking features, when it is desired to avoid the additional processing utilized to redistribute the metal-containing regions, and/or when the pattern of the mushroomed features is better suited for a particular application than the pattern of the redistributed metal-containing regions.

FIGS. 1-16 describe processing that may be conducted with a block copolymer assembly configured to comprise cylinders extending parallel to an upper surface of a substrate, and contained within matrix. Block copolymer assemblies may comprise numerous other configurations depending on various parameters utilized in the formation of the assemblies, such as, for example, the chemical makeup of the copolymer and the conditions utilized to induce assembly within the copolymer. Methodologies of the type described with reference to FIGS. 1-16 may be utilized in conjunction with other configurations of block copolymer assemblies. For instance, FIGS. 17-24 illustrate an example process that may be utilized with a configuration of a block copolymer assembly in which one of the domains corresponds to spherical features. Similar numbering will be utilized to describe FIGS. 17-24 as is utilized above in describing FIGS. 1-16, where appropriate.

Figure 17:
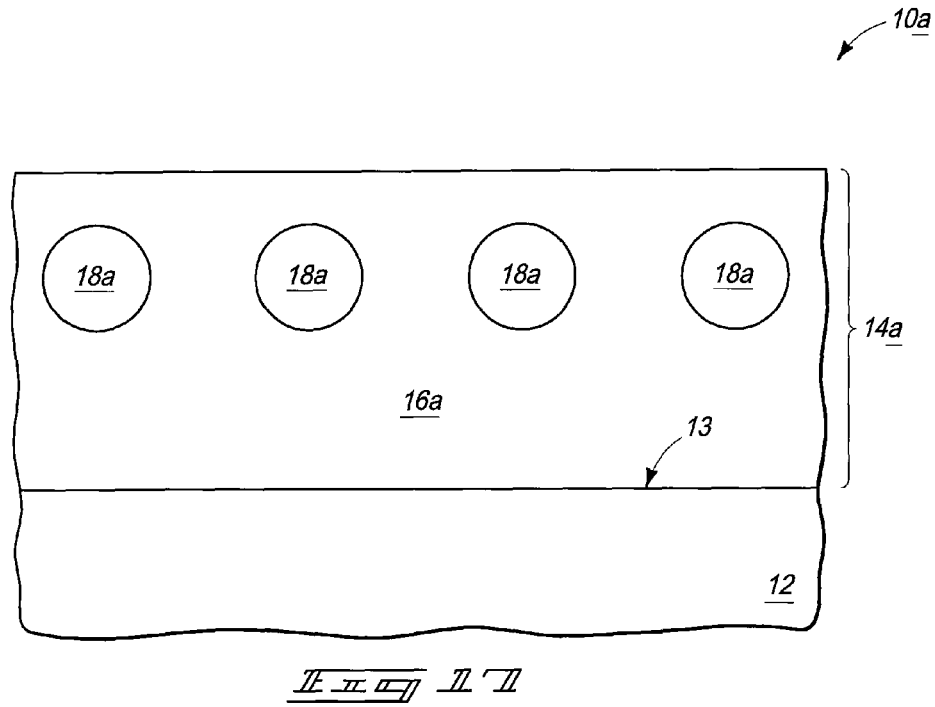
FIGS. 17 and 18 are a diagrammatic cross-sectional side view, and a diagrammatic top view, respectively, of a construction at a processing stage of another example embodiment. The cross-sectional view of FIG. 17 is along the line 17-17 of FIG. 18.
Figure 18:
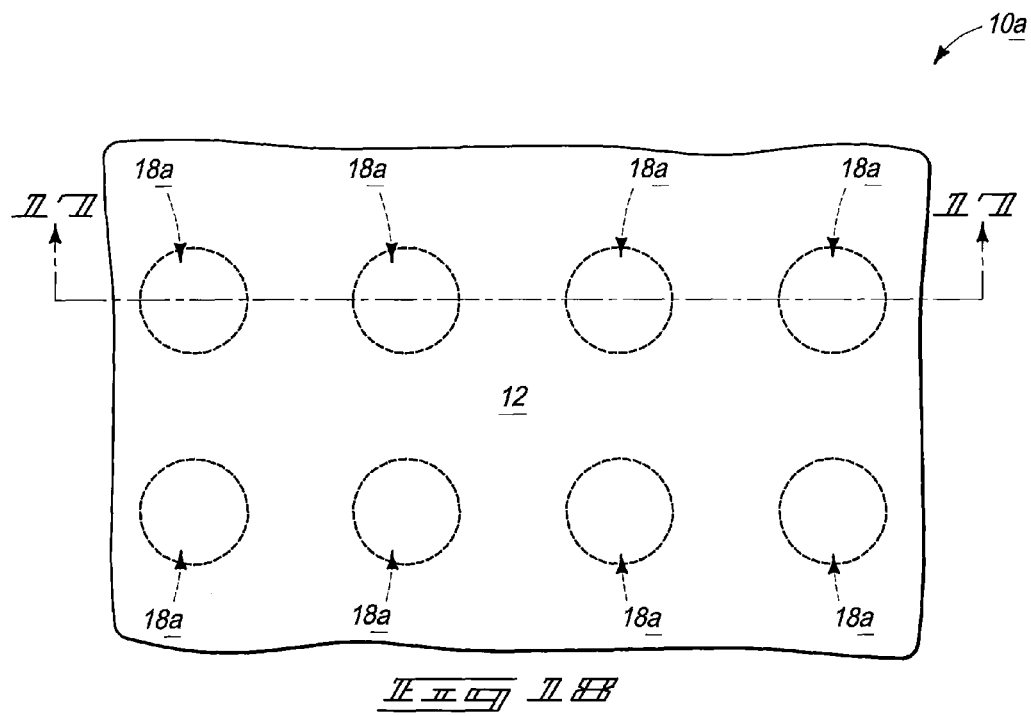

Referring to FIGS. 17 and 18, a construction 10a is shown to comprise a block copolymer assembly 14a formed over a substrate 12.

Figure 60:
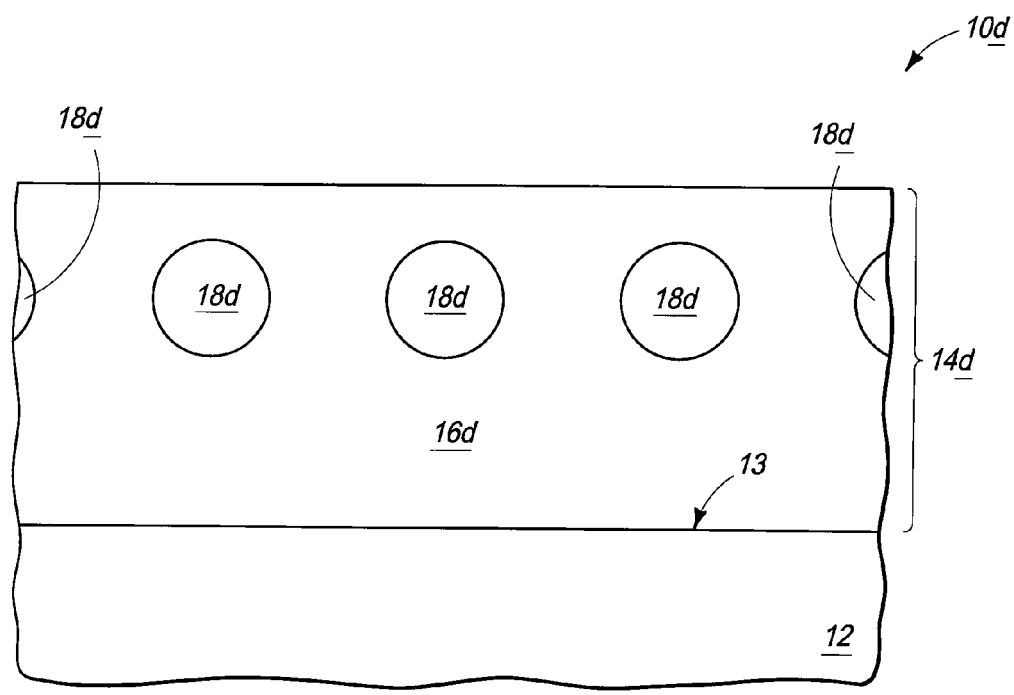
FIGS. 60 and 61 are a diagrammatic cross-sectional side view, and a diagrammatic top view, respectively, of a construction analogous to that of FIGS. 17 and 18, but the construction of FIGS. 60 and 61 results from hexagonal close-packed unit cells rather than cubic unit cells. The cross-sectional view of FIG. 60 is along the line 60-60 of FIG. 61.
Figure 61:
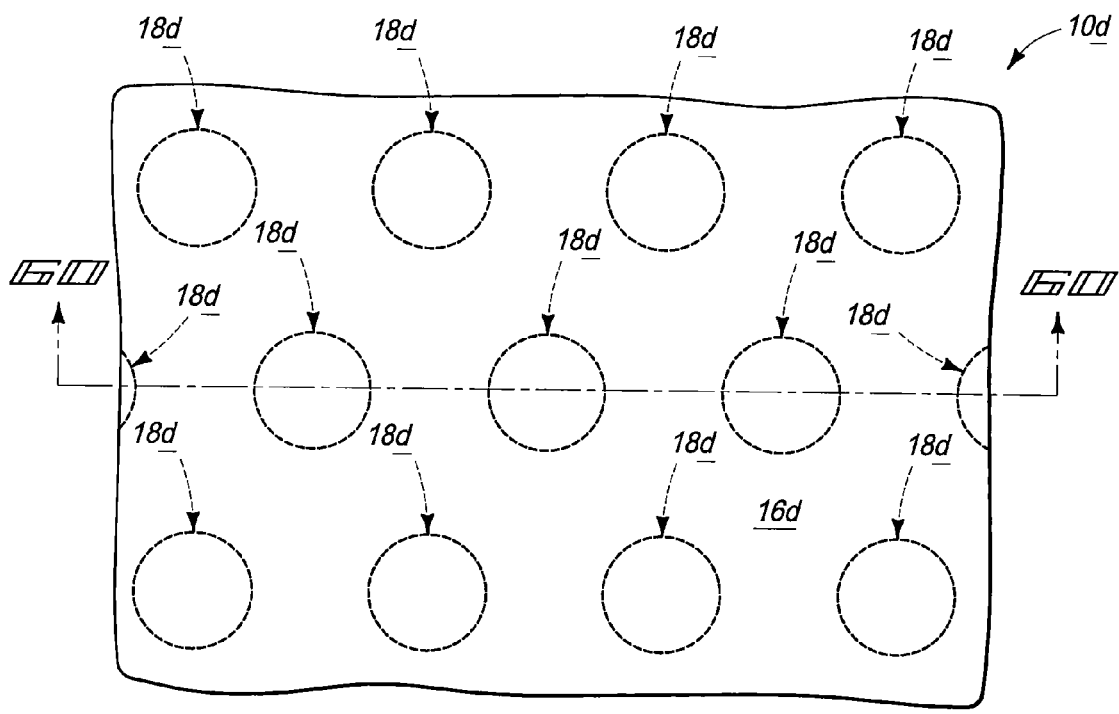

The block copolymer assembly 14a is arranged in a pattern comprising two different domains; with one of the domains corresponding to a matrix 16a, and the other of the domains corresponding to features 18a entirely contained within such matrix. The features 18a are spherical micelles, and are shown in dashed-line view in the top view of FIG. 18 to indicate that features 18a are beneath an upper surface of matrix 16a. The construction 10a of FIGS. 17 and 18 shows the micelles in a pattern which would correspond to cubic unit cells, which may be advantageous for patterning cross-point architecture in that it can be a 4F² layout (where "F" is a minimum feature size). In other embodiments the micelles may be in different arrangements. For instance, FIGS. 60 and 61 show a construction 10d at a processing stage analogous to that of FIGS. 17 and 18, but in which the micelle pattern corresponds to hexagonal close-packed unit cells. The construction of FIGS. 60 and 61 may be processed with methodology analogous to that described below for processing the construction 10a of FIGS. 17 and 18.

Referring to FIGS. 19 and 20, construction 10a is shown at a processing stage analogous to that of FIG. 13, and specifically is shown to comprise a patterned mask 32a. Mask 32a may be formed by: treating features 18a (FIGS. 17 and 18) to cause extrusion through a matrix domain in a process analogous to that described with reference to FIGS. 3 and 4; incorporating metal in a process analogous to that described with reference to FIGS. 5 and 6; reabsorption of the metal-containing regions to from metal-containing features 28a in a process analogous to that described with reference to FIGS. 11 and 12; and anisotropic etching to remove some of the block copolymer and form the patterned mask 32a in a process analogous to that described with reference to FIGS. 13 and 14.

The metal-containing features 28a of mask 32a are spheres; and thus the masking structures formed with features 28a are pillar-shaped, and extend normal relative to planar surface 13 of substrate 12.

Figure 21:
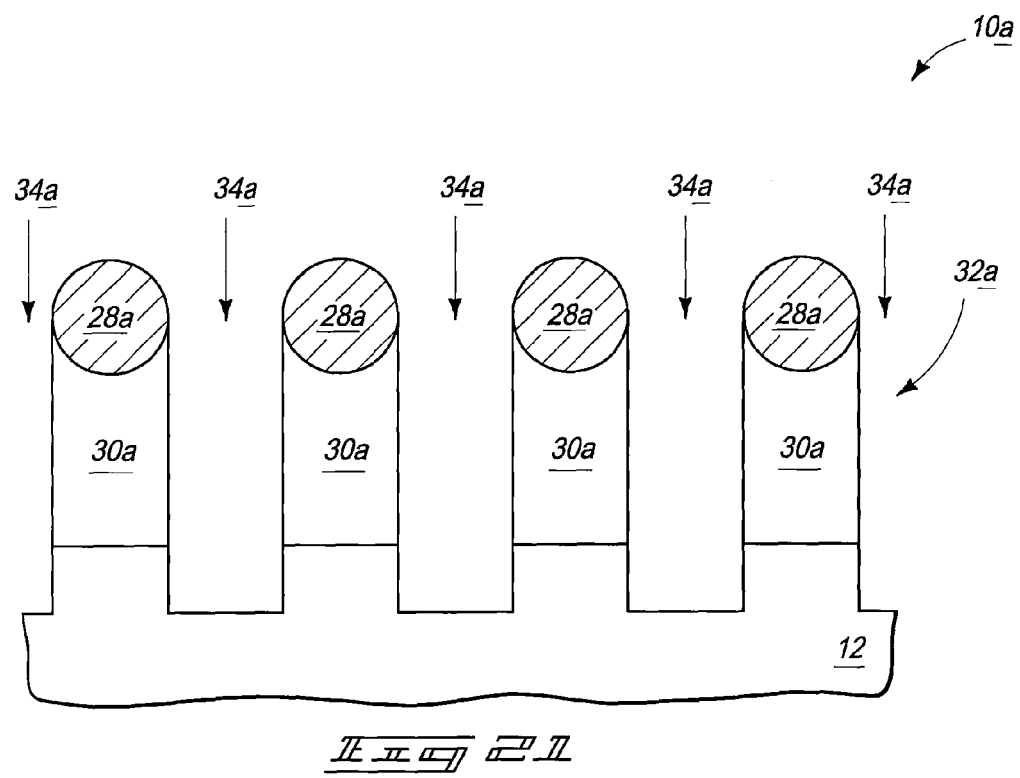
FIGS. 21 and 22 are a diagrammatic cross-sectional side view, and a diagrammatic top view, respectively, of the construction of FIGS. 17 and 18 shown at a processing stage subsequent to that of FIGS. 19 and 20. The cross-sectional view of FIG. 21 is along the line 21-21 of FIG. 22.
Figure 22:
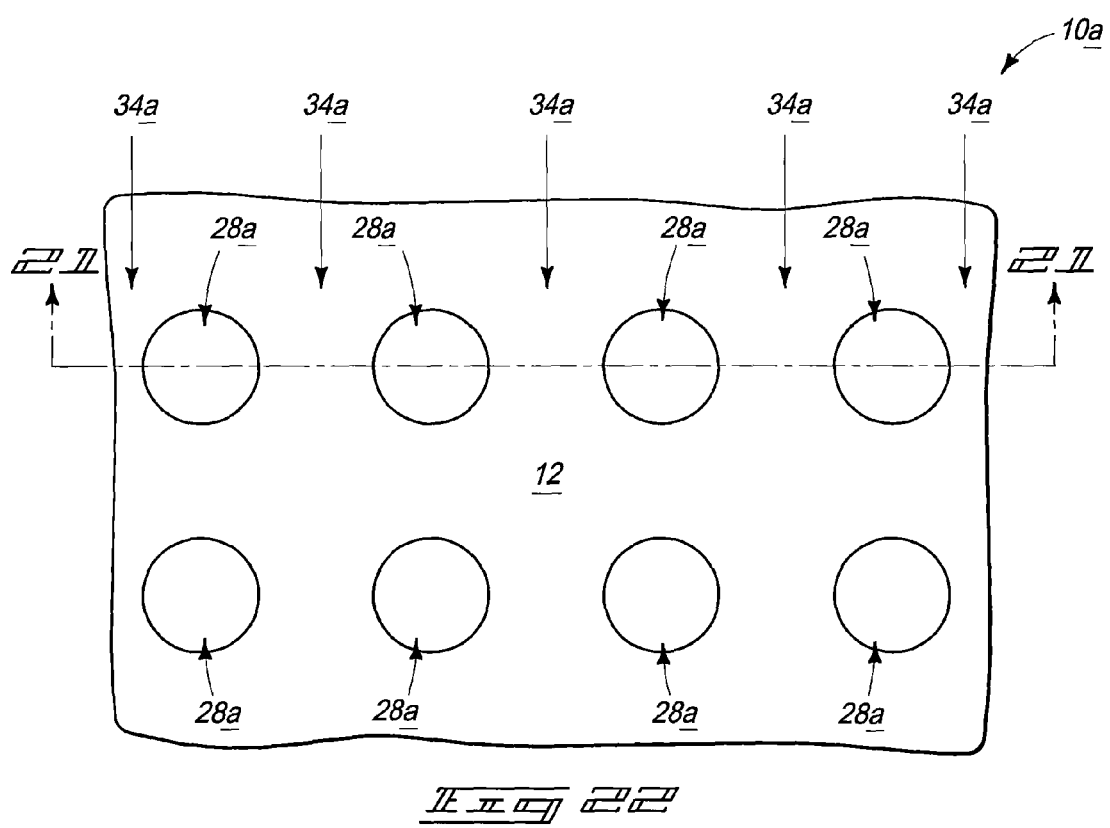

Referring to FIGS. 21 and 22, the pattern defined by patterned mask 32a is transferred into substrate 12 by extending gaps 34a into the substrate with one or more suitable etches.

Figure 23:
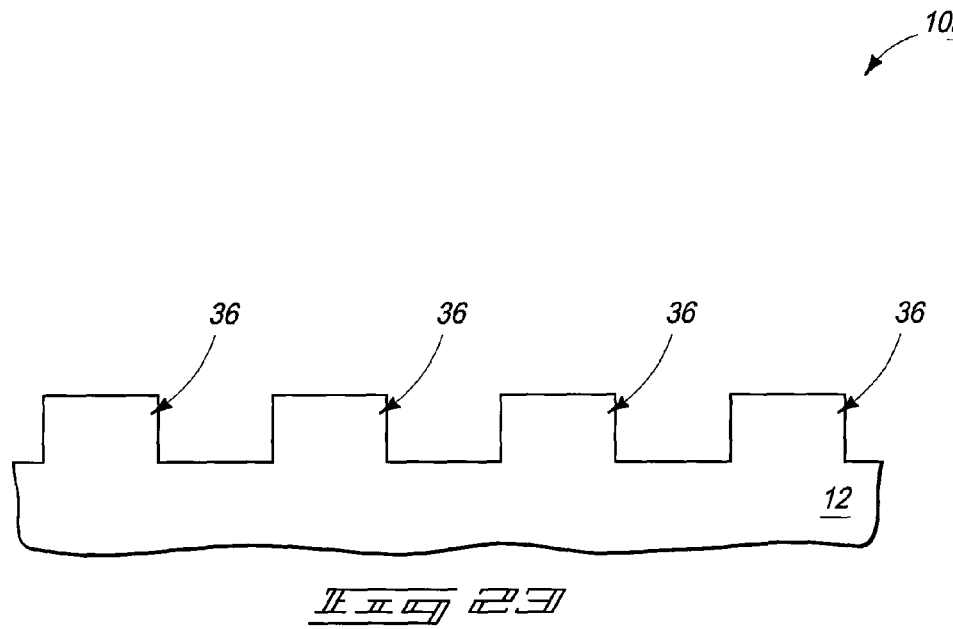
FIGS. 23 and 24 are a diagrammatic cross-sectional side view, and a diagrammatic top view, respectively, of the construction of FIGS. 17 and 18 shown at a processing stage subsequent to that of FIGS. 21 and 22. The cross-sectional view of FIG. 23 is along the line 23-23 of FIG. 24.
Figure 24:
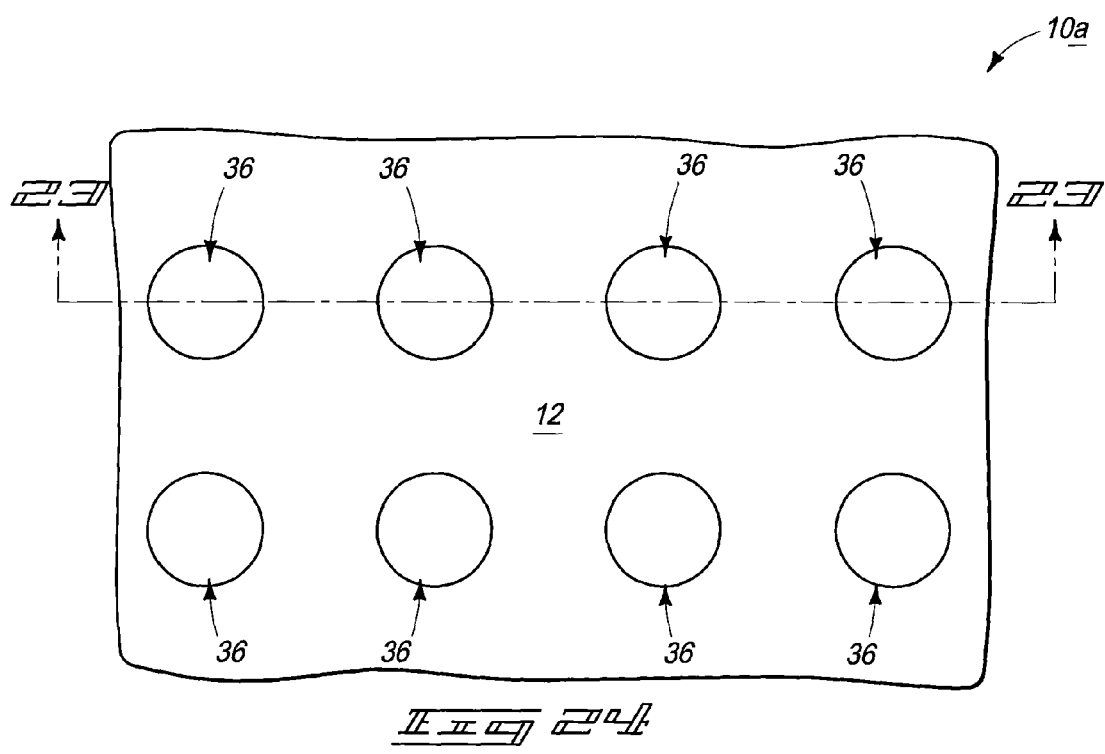

Referring to FIGS. 23 and 24, patterned mask 32a (FIGS. 21 and 22) is removed to leave a plurality of patterned features 36 associated with substrate 12. In alternative embodiments, the patterned mask may be left over substrate 12 to be incorporated into integrated circuit structures.

Although the processing of FIGS. 17-24 forms a patterned mask from metal-comprising features reabsorbed into a matrix, in other embodiments spherical micelles of the type shown in FIGS. 17 and 18 may be utilized to form a patterned mask analogous to that of FIGS. 7 and 8 (i.e., a patterned mask comprising mushroomed features).

FIGS. 25-34 illustrate an example process that may be utilized with another configuration of a block copolymer assembly. Similar numbering will be utilized to describe FIGS. 25-34 as is utilized above in describing FIGS. 1-16, where appropriate.

Figure 25:
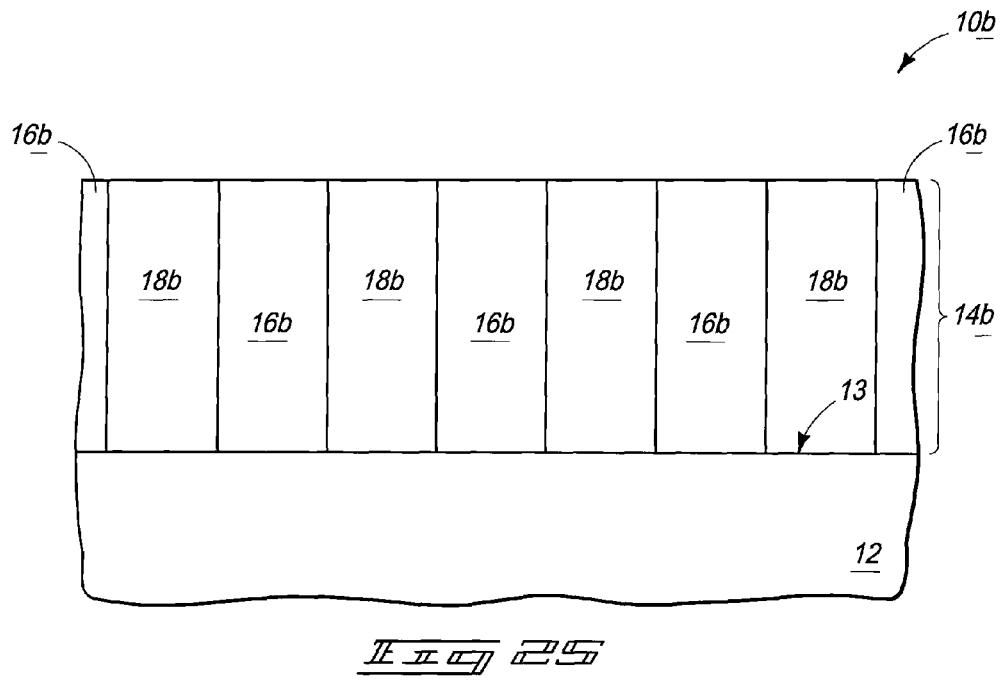
FIGS. 25 and 26 are a diagrammatic cross-sectional side view, and a diagrammatic top view, respectively, of a construction at a processing stage of another example embodiment. The cross-sectional view of FIG. 25 is along the line 25-25 of FIG. 26.
Figure 26:
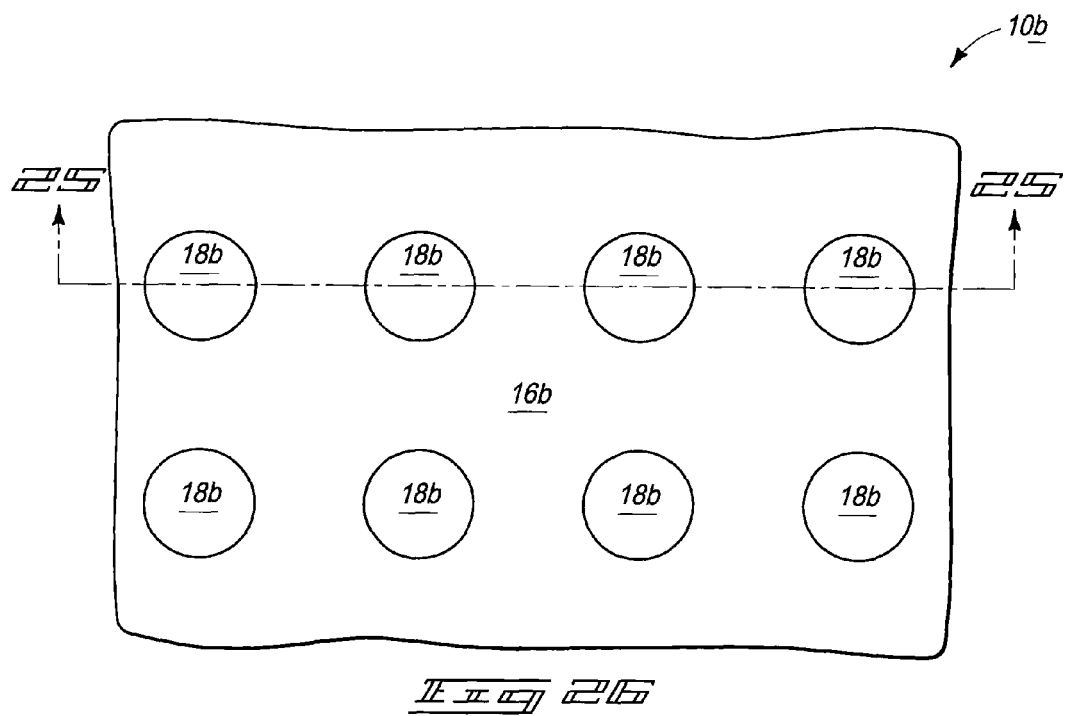

Referring to FIGS. 25 and 26, a construction 10b is shown to comprise a block copolymer assembly 14b formed over a substrate 12.

Figure 62:
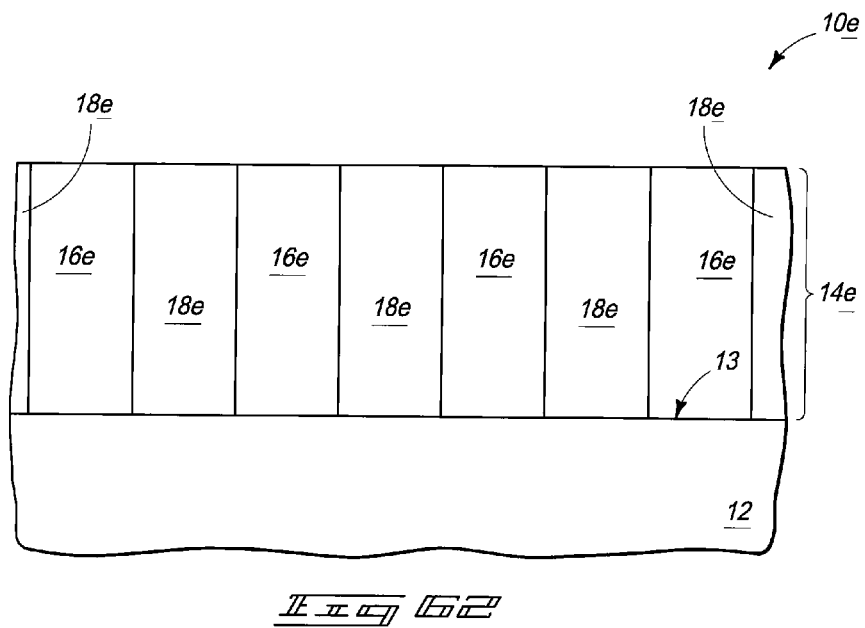
FIGS. 62 and 63 are a diagrammatic cross-sectional side view, and a diagrammatic top view, respectively, of a construction analogous to that of FIGS. 25 and 26, but the construction of FIGS. 62 and 63 results from hexagonal close-packed unit cells rather than cubic unit cells. The cross-sectional view of FIG. 62 is along the line 62-62 of FIG. 63.

The block copolymer assembly 14b is arranged in a pattern comprising two different domains; with one of the domains corresponding to a matrix 16b, and the other of the domains corresponding to features 18b. In the shown embodiment, substrate 12 has a planar upper surface 13, and the features 18b are cylinders that extend linearly along a direction normal to such planar surface. The construction 10b of FIGS. 25 and 26 shows the features 18b in a pattern which would correspond to cubic unit cells, which may be advantageous for patterning cross-point architecture in that it can be a 4F² layout (where "F" is a minimum feature size). In other embodiments the cylindrical features may be in different arrangements. For instance, FIGS. 62 and 63 show a construction 10e at a processing stage analogous to that of FIGS. 25 and 26, but in which the features are arranged in pattern corresponding to hexagonal close-packed unit cells. The construction of FIGS. 62 and 63 may be processed with methodology analogous to that described below for processing the construction 10b of FIGS. 25 and 26.

Figure 27:
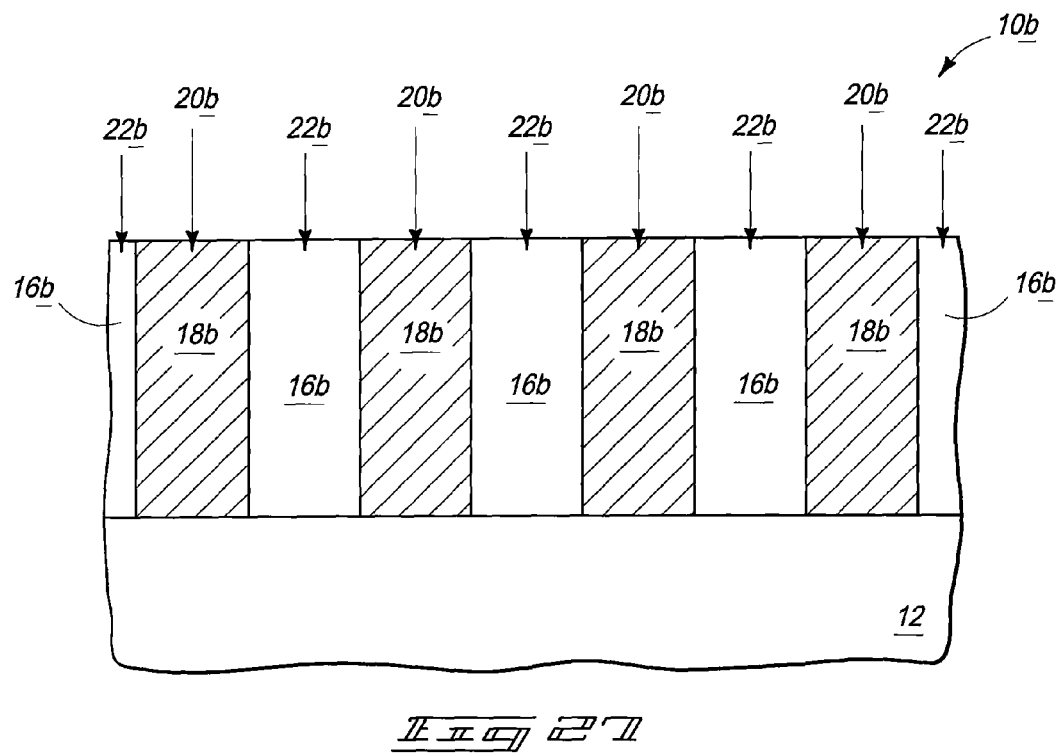
FIGS. 27 and 28 are a diagrammatic cross-sectional side view, and a diagrammatic top view, respectively, of the construction of FIGS. 25 and 26 shown at a processing stage subsequent to that of FIGS. 25 and 26. The cross-sectional view of FIG. 27 is along the line 27-27 of FIG. 28.
Figure 28:
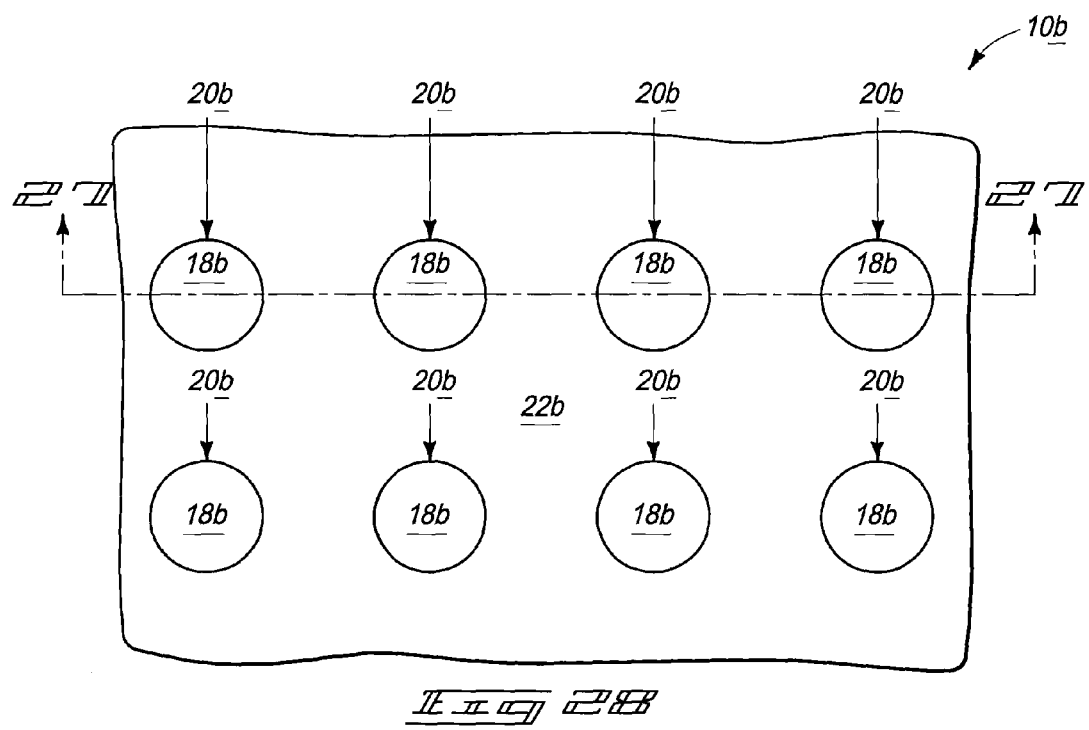

Referring to FIGS. 27 and 28, construction 10b is exposed to metal, and the metal selectively couples to the first subunits of features 18b relative to the second subunits of matrix 16b.

The features 18b having metal incorporated therein become metal-containing regions 20b, while the matrix 16b is a non-metal-containing region 22b. In other embodiments, the metal may be selectively coupled to the second subunits of matrix 16b relative to the first subunits of features 18b. Regardless, a pattern of metal-containing regions and non-metal-containing regions is formed by the selective coupling of metal to some of the subunits relative to others of the subunits.

Since regions 18b of the copolymer assembly 14b have exposed surfaces, the mushrooming of FIGS. 3 and 4 may be omitted during the processing of the copolymer assembly 14b. Instead, metal may interact with regions 18b regardless of whether copolymer assembly 14b is treated to cause mushrooming of regions 18b. However, in some embodiments it may be desired to treat copolymer assembly 14b with conditions analogous to those discussed above with reference to FIGS. 3 and 4 in order to create swelling within regions 18b to provide more surface area of regions 18b to interact with metal, and/or to provide a desired charge within regions 18b.

Referring to FIGS. 29 and 30, non-metal-containing regions 22b (FIGS. 27 and 28) are removed selectively relative to metal-containing regions 20b to form a patterned mask 24b containing metal from the metal-containing regions 20b, with such metal-containing regions being spaced from one another by gaps 26b. The non-metal containing regions of the block copolymer may be removed with any appropriate etch.

Figure 31:
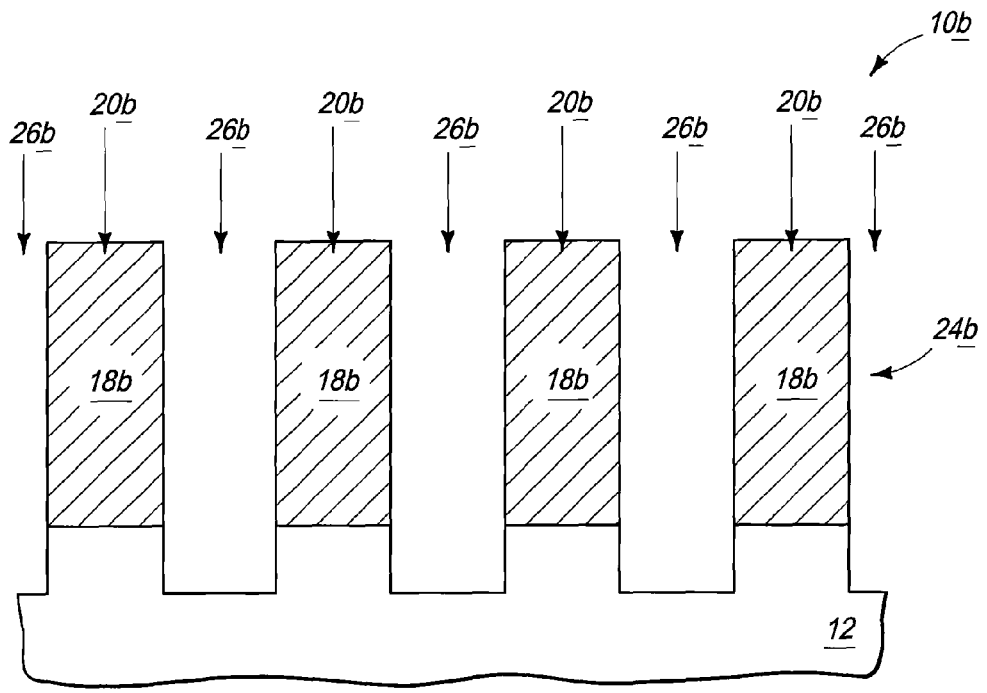
FIGS. 31 and 32 are a diagrammatic cross-sectional side view, and a diagrammatic top view, respectively, of the construction of FIGS. 25 and 26 shown at a processing stage subsequent to that of FIGS. 29 and 30. The cross-sectional view of FIG. 31 is along the line 31-31 of FIG. 32.
Figure 32:
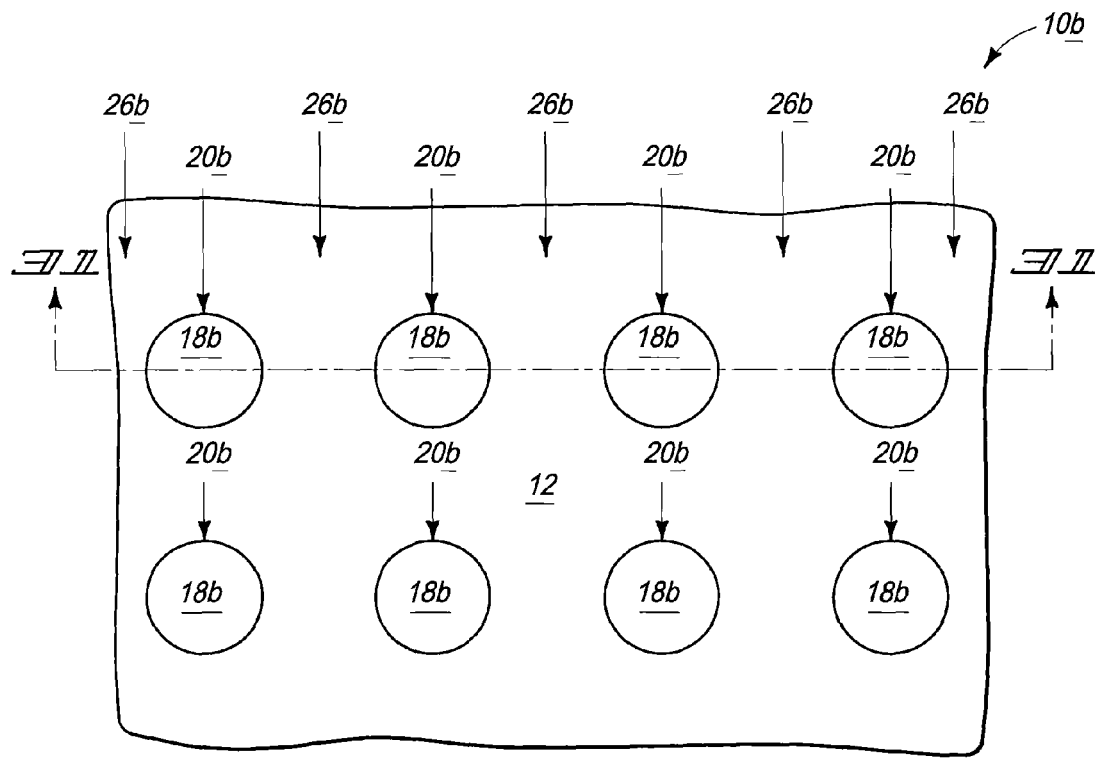

Referring to FIGS. 31 and 32, the pattern defined by patterned mask 24b is transferred into substrate 12 by extending gaps 26b into the substrate with one or more suitable etches.

Referring to FIGS. 33 and 34, patterned mask 24b (FIGS. 31 and 32) is removed to leave a plurality of patterned features 38 associated with substrate 12. In alternative embodiments, the patterned mask may be left over substrate 12 to be incorporated into integrated circuit structures.

FIGS. 35-44 illustrate an example process that may be utilized with another configuration of a block copolymer assembly. Similar numbering will be utilized to describe FIGS. 35-44 as is utilized above in describing FIGS. 1-16, where appropriate.

Figure 35:
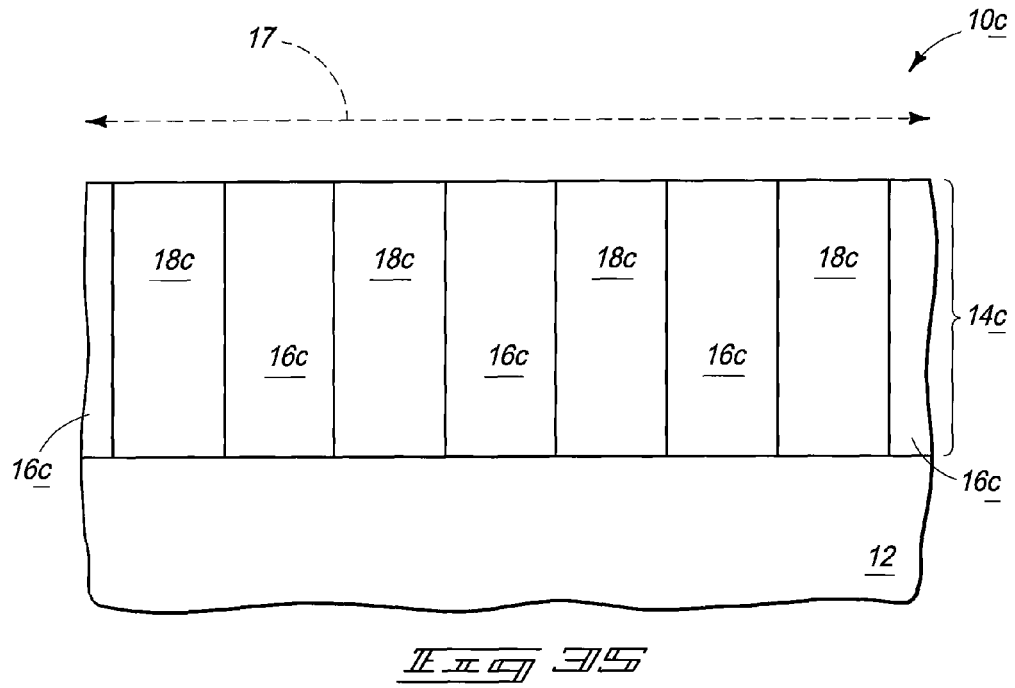
FIGS. 35 and 36 are a diagrammatic cross-sectional side view, and a diagrammatic top view, respectively, of a construction at a processing stage of another example embodiment. The cross-sectional view of FIG. 35 is along the line 35-35 of FIG. 36.
Figure 36:
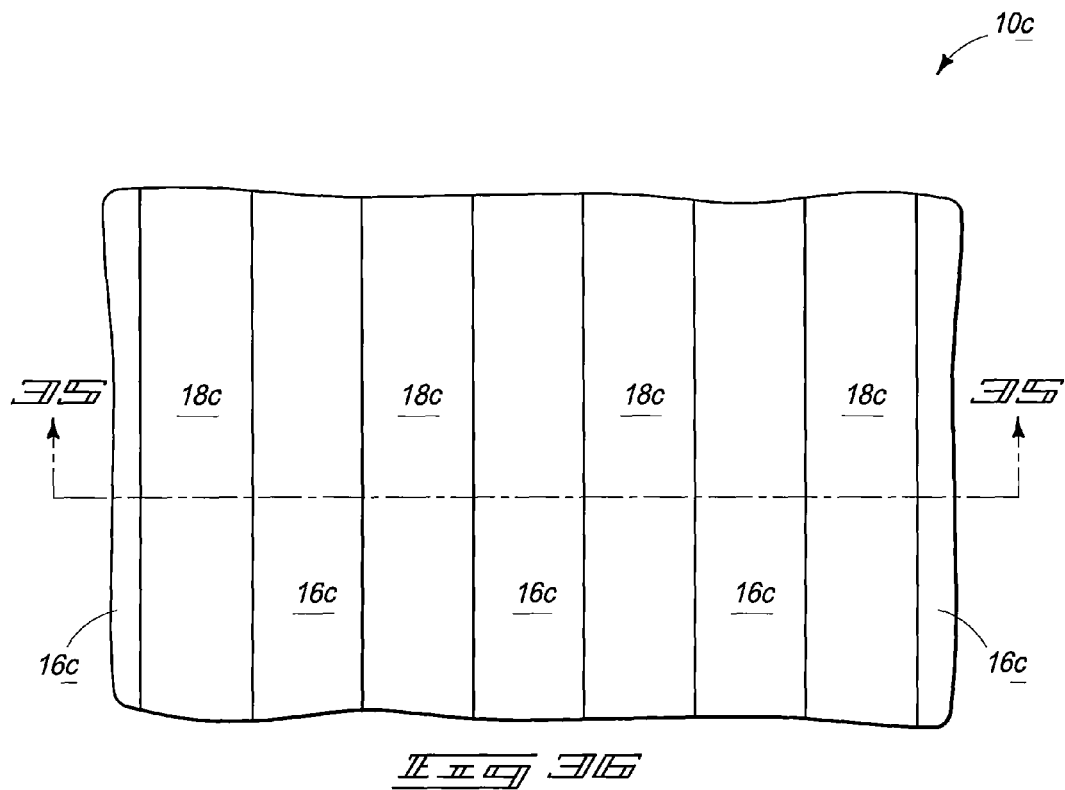

Referring to FIGS. 35 and 36, a construction 10c is shown to comprise a block copolymer assembly 14c formed over a substrate 12.

The block copolymer assembly 14c is arranged in a pattern comprising two different domains; with one of the domains corresponding to first lamellae 16c, and the other of the domains corresponding to second lamellae 18c. In the shown embodiment, substrate 12 has a planar upper surface 13, and the first and second lamellae 16c and 18c alternate with one another along a direction 17 which is parallel to such planar surface.

Referring to FIGS. 37 and 38, construction 10c is exposed to metal, and the metal selectively couples to the second lamellae 18c relative to the first lamellae 16c. The lamellae 18c having metal incorporated therein become metal-containing regions 20c, while the lamellae 16c remain non-metal-containing regions 22c.

Since lamellae 18c of the copolymer assembly 14c have exposed surfaces, the swelling (i.e., mushrooming or blooming) of FIGS. 3 and 4 may be omitted during the processing of the copolymer assembly 14c. Instead, metal may interact with lamellae 18c regardless of whether copolymer assembly 14c is treated to cause swelling of regions 18c. However, in some embodiments it may be desired to treat copolymer assembly 14c with conditions analogous to those discussed above with reference to FIGS. 3 and 4 in order to create swelling within lamellae 18c to provide more exposed surface area of regions 18c to interact with metal, and/or to provide a desired charge within regions 18c.

Referring to FIGS. 39 and 40, non-metal-containing regions 22c (FIGS. 37 and 38) are removed selectively relative to metal-containing regions 20c to form a patterned mask 24c containing metal from the metal-containing regions 20c, with such metal-containing regions being spaced from one another by gaps 26c.

Figure 41:
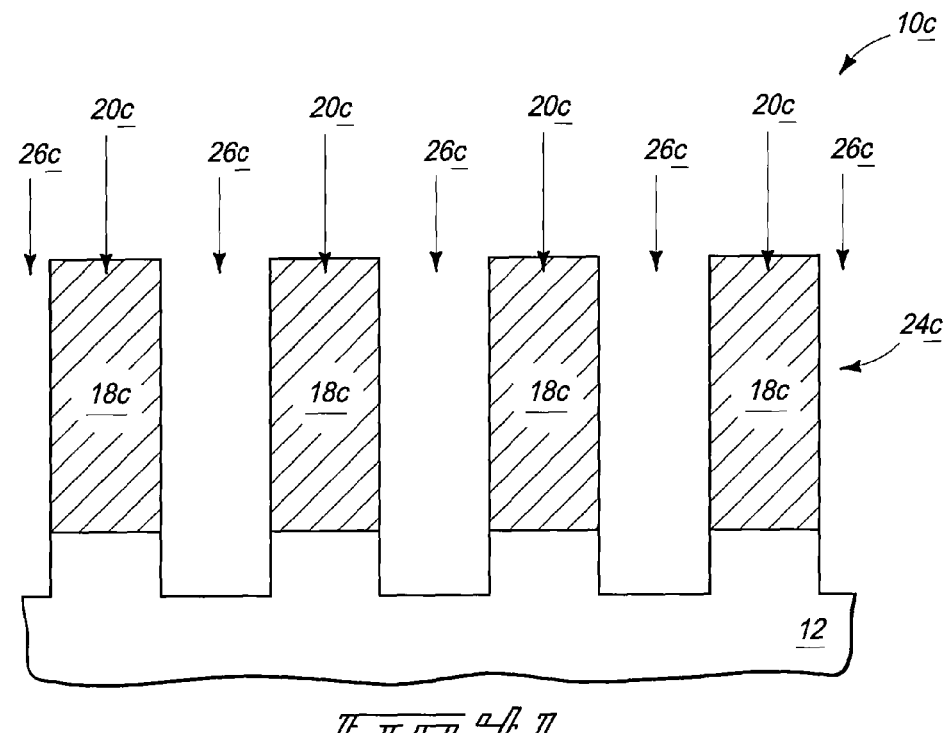
FIGS. 41 and 42 are a diagrammatic cross-sectional side view, and a diagrammatic top view, respectively, of the construction of FIGS. 35 and 36 shown at a processing stage subsequent to that of FIGS. 39 and 40. The cross-sectional view of FIG. 41 is along the line 41-41 of FIG. 42.
Figure 42:
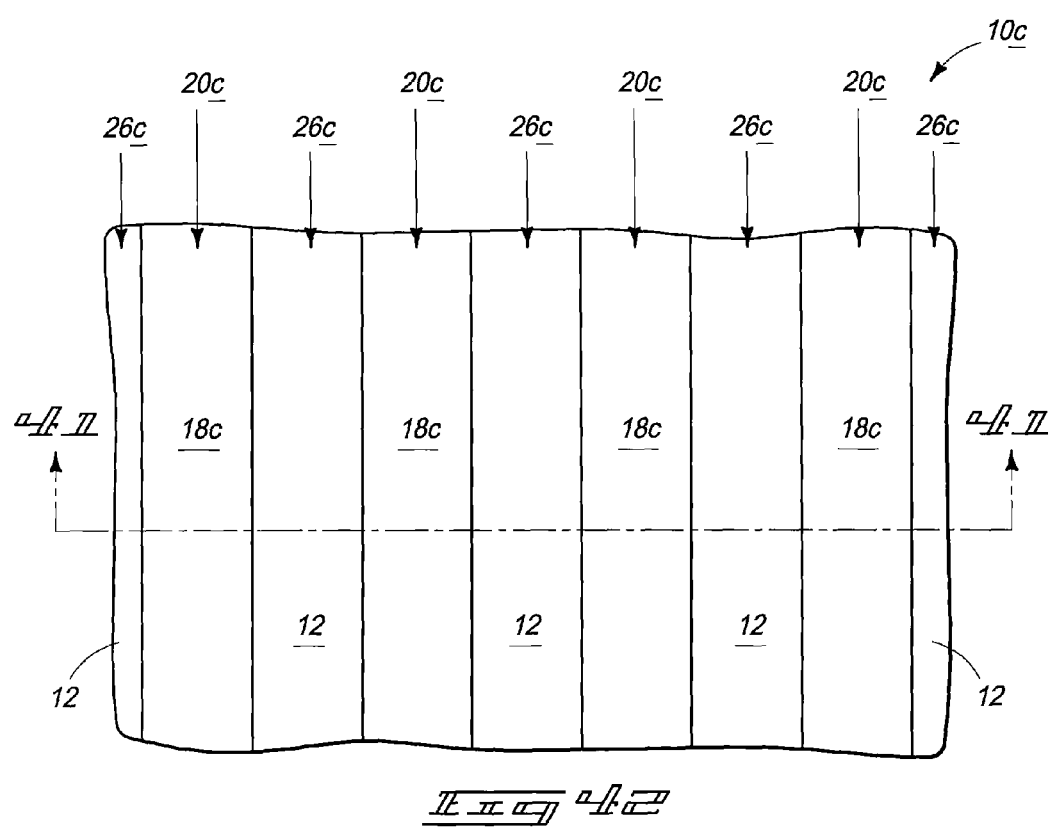

Referring to FIGS. 41 and 42, the pattern defined by patterned mask 24c is transferred into substrate 12 by extending gaps 26c into the substrate with one or more suitable etches.

Referring to FIGS. 43 and 44, patterned mask 24c (FIGS. 41 and 42) is removed to leave a plurality of patterned features 38c associated with substrate 12. In alternative embodiments, the patterned mask may be left over substrate 12 to be incorporated into integrated circuit structures.

Substrate 12 can comprise any of numerous configurations depending on the structures that are ultimately desired to be formed with the processing of FIGS. 1-44. In some embodiments substrate 12 may comprise conductive materials that are ultimately desired to be patterned into integrated circuitry. For example, in some embodiments substrate 12 may comprise various materials desired to be patterned into cross-point architecture. As another example, in some embodiments substrate 12 may comprise gate stacks that are ultimately desired to be patterned into a plurality of wordlines.

FIGS. 45-59 illustrate example embodiments in which patterned masks of the types described in FIGS. 1-44 may be utilized to pattern gate stacks.

Figure 45:
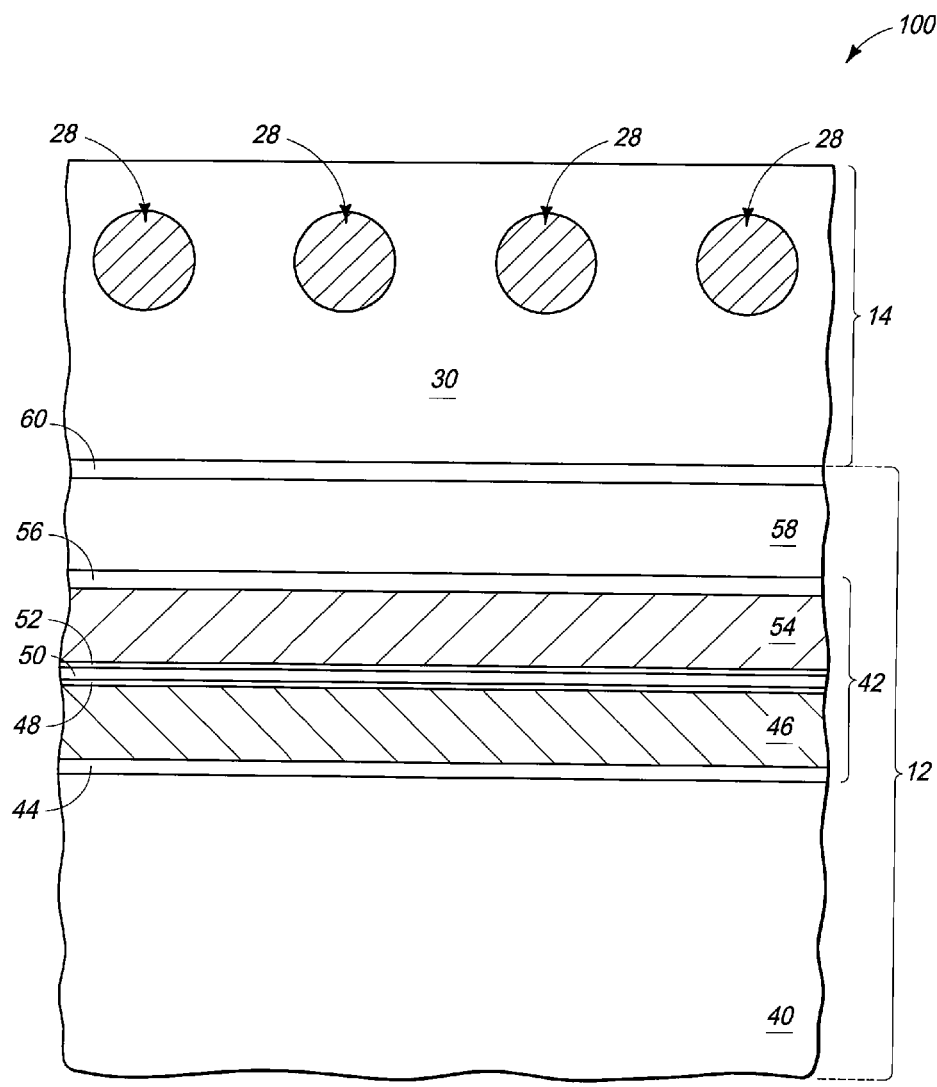
FIG. 45 is a diagrammatic cross-sectional side view of an example semiconductor construction at a processing stage analogous to that of FIG. 11 of another example embodiment.

Referring to FIG. 45, a semiconductor construction 100 is illustrated. The construction includes a substrate 12 having a block copolymer assembly 14 thereover. The block copolymer assembly is shown to have the configuration of the assembly 14 described above with reference to FIGS. 11 and 12. In other embodiments, other block copolymer assembly configurations may be utilized. The illustrated block copolymer assembly 14 comprises metal-containing features 28 supported within a matrix 30.

Substrate 12 is shown to comprise a base 40 supporting a gate stack 42 thereover. The gate stack 42 includes gate dielectric material 44, charge storage material 46, body dielectric materials 48, 50 and 52, control gate material 54, and dielectric capping material 56. The gate dielectric material 44 may comprise any suitable composition or combination of compositions, and in some embodiments may comprise, consist essentially of, or consist of silicon oxide. The charge storage material 46 may comprise any suitable composition or combination of compositions, and in some embodiments may comprise floating gate material (for instance, polysilicon), or charge-trapping material (for instance, silicon nitride, nanodots, etc.). The body dielectric materials 48, 50 and 52 may comprise any suitable compositions or combinations of compositions, and in some embodiments may comprise hafnium oxide, zirconium oxide, silicon dioxide, etc. The control gate material 54 may comprise any suitable composition or combination of compositions, and in some embodiments may comprise metal, metal-containing compositions, and/or conductively-doped semiconductor materials. The capping dielectric material 56 may comprise any suitable composition or combination of compositions, and in some embodiments may comprise one or more of silicon dioxide, silicon nitride and silicon oxynitride.

The gate stack 42 is one example of a gate stack, and specifically is an example of a gate stack that may be utilized to form nonvolatile memory. Other gate stacks may be used in other embodiments. Another example gate stack is a gate stack utilized to form field effect transistors, which would typically comprise electrically conductive gate material sandwiched between gate dielectric and dielectric capping material. Regardless of whether a gate stack is configured to form nonvolatile memory or field effect transistors, the gate stack will generally comprise at least one conductive material.

Patterning materials 58 and 60 are formed over gate stack 42. The patterning material 58 may comprise, consist essentially of, or consist of carbon; and in some embodiments may be amorphous carbon. The patterning material 60 may be a hardmask, and in some embodiments may comprise, consist essentially of, or consist of silicon nitride or silicon oxynitride.

Although FIG. 45 is described as having a substrate 12 that comprises patterning materials 58 and 60; the substrate of the construction may be alternatively considered to comprise only the structures under the patterning materials (i.e., the gate stack 42 and base 40) rather than including the patterning materials.

Figure 46:
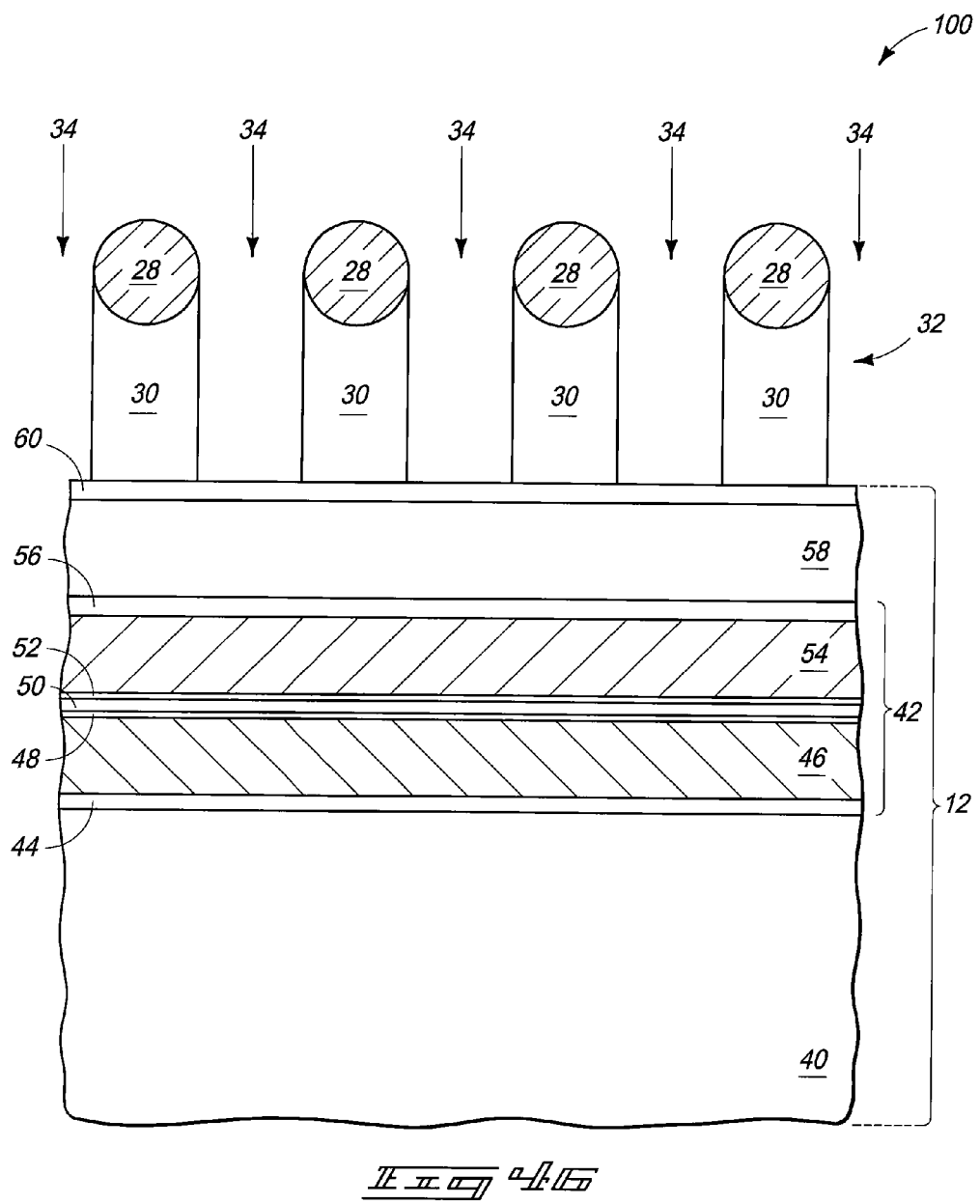
FIG. 46 is a diagrammatic cross-sectional side view of the semiconductor construction of FIG. 45 shown at a processing stage subsequent to that of FIG. 45.

Referring to FIG. 46, regions of matrix 30 are removed with processing of the type described above with reference to FIGS. 13 and 14. Such forms gaps 34 between metal-containing regions 28, and thereby forms the patterned mask 32 over substrate 12.

Figure 47:
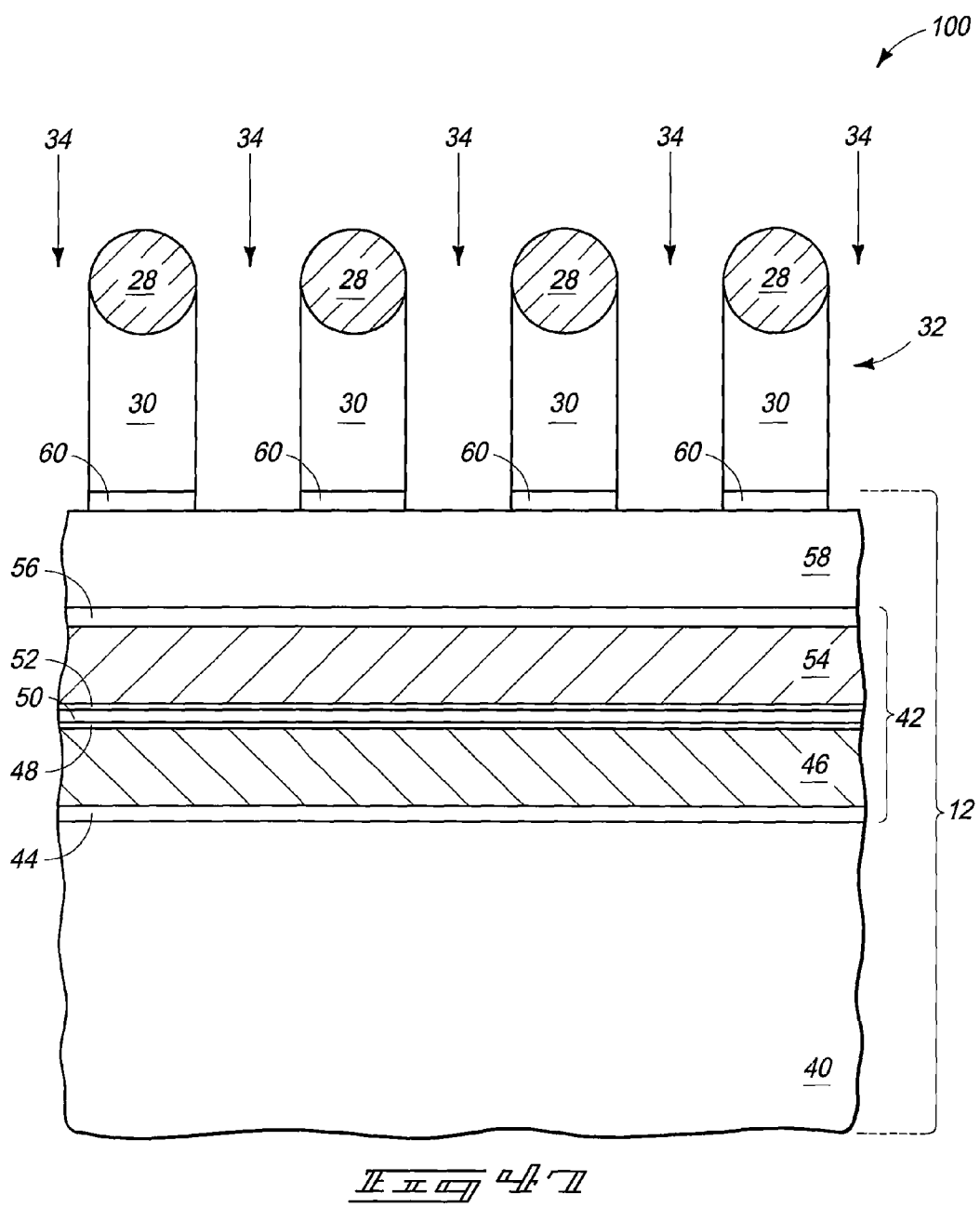
FIG. 47 is a diagrammatic cross-sectional side view of the semiconductor construction of FIG. 45 shown at a processing stage subsequent to that of FIG. 46.

Referring to FIG. 47, a pattern is transferred from mask 32 into hardmask material 60 with one or more suitable etches. In the shown embodiment, the patterning only transfers through hardmask 60, and not into masking material 58. In other embodiments, the etch utilized to pattern through material 60 may also penetrate at least partially into material 58.

Figure 48:
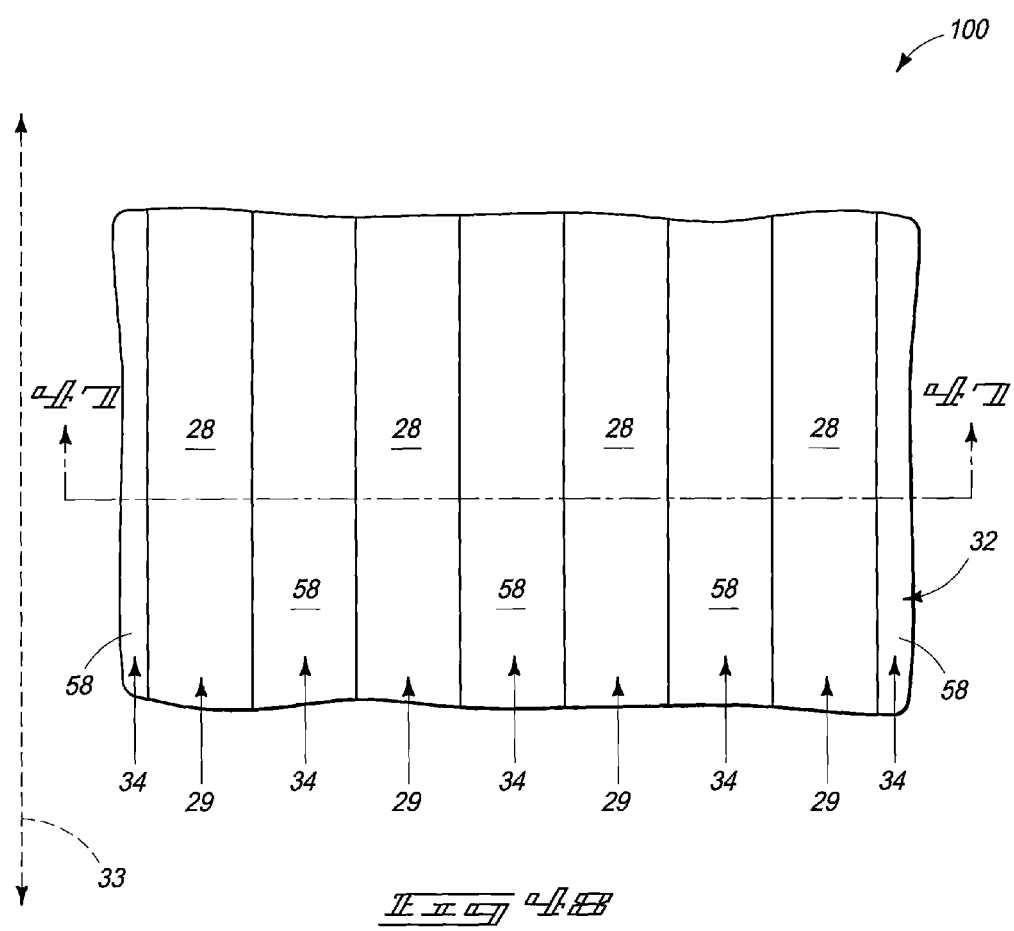
FIG. 48 is a diagrammatic top view of the semiconductor construction of FIG. 47. The cross-sectional view of FIG. 47 is along the line 47-47 of FIG. 48.

FIG. 48 shows a top view of the construction of FIG. 47, and shows that mask 32 comprises a plurality of lines 29 extending linearly along a direction 33, and that gaps 34 are trenches between such lines.

Figure 49:
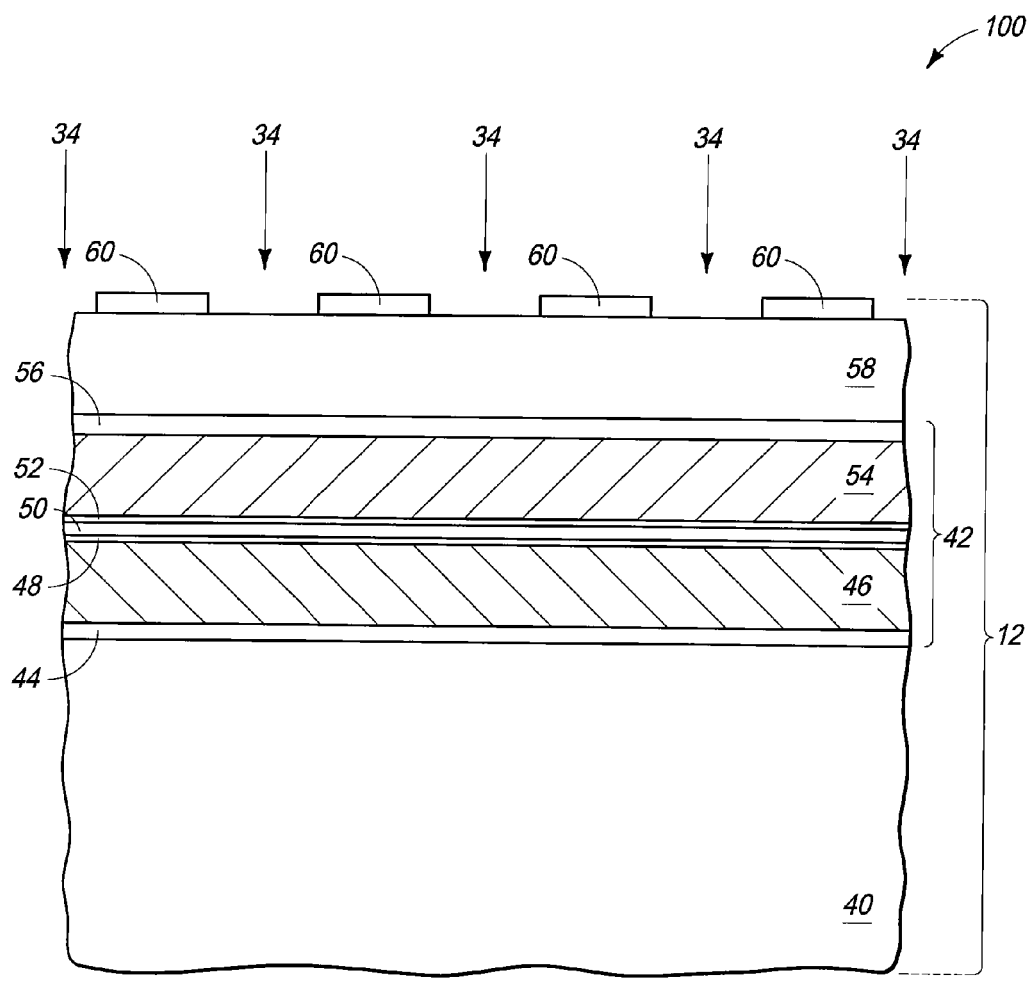
FIG. 49 is a diagrammatic cross-sectional side view of the semiconductor construction of FIG. 45 shown at a processing stage subsequent to that of FIG. 47.
Figure 50:
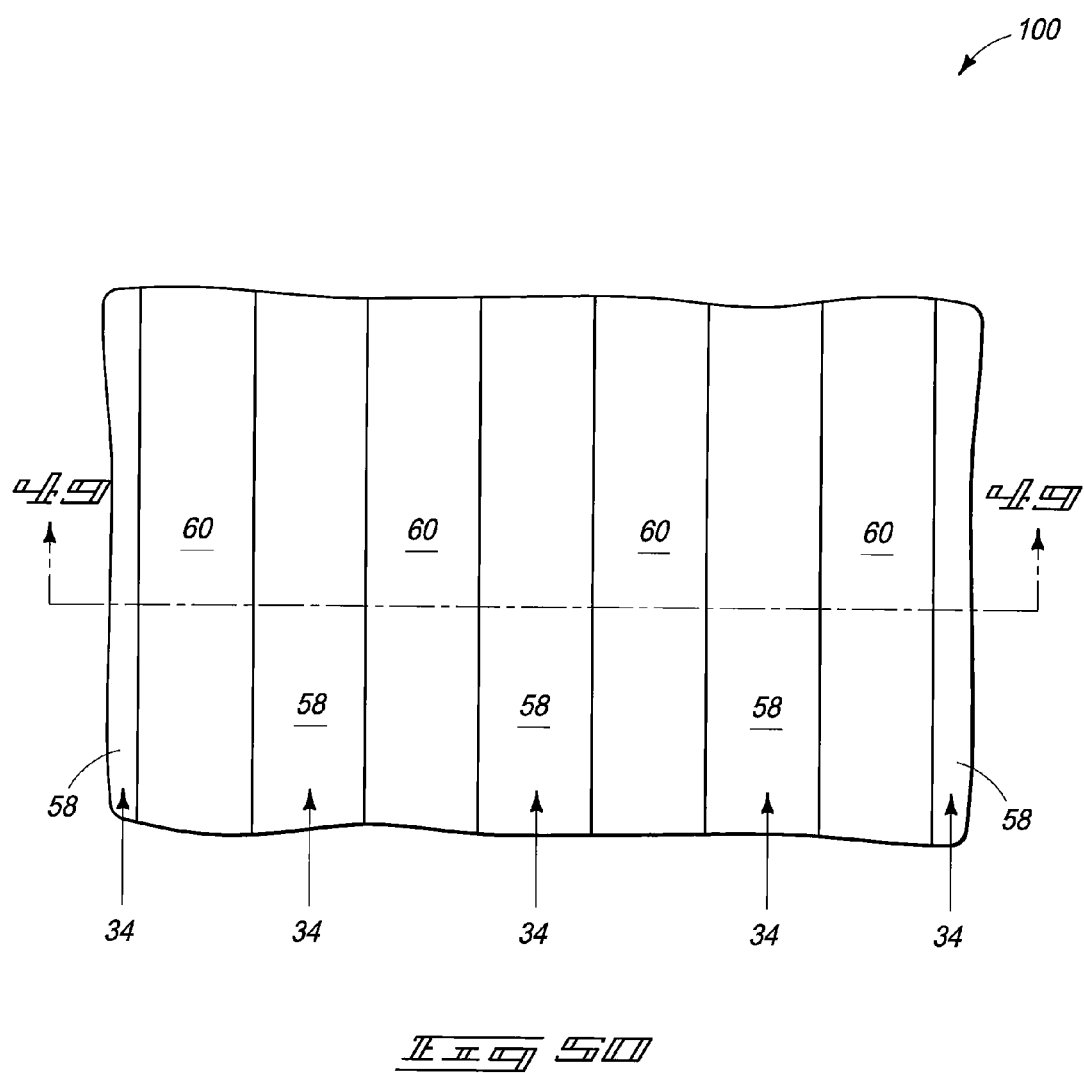
FIG. 50 is a diagrammatic top view of the semiconductor construction of FIG. 49. The cross-sectional view of FIG. 49 is along the line 49-49 of FIG. 50.

Referring to FIGS. 49 and 50, masking materials 28 and 30 (FIGS. 47 and 48) are removed from over substrate 12, to leave patterned hardmask 60 as the patterned masking material over the gate stack.

Figure 51:
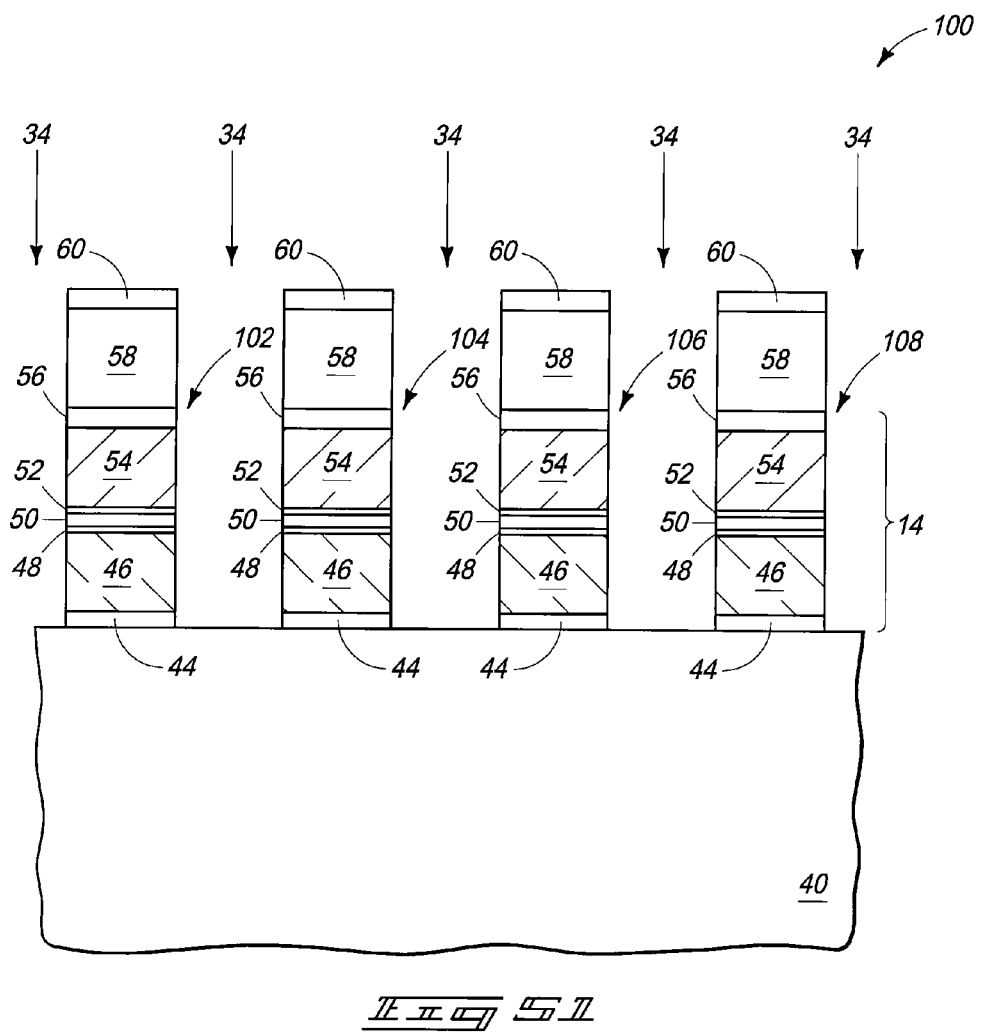
FIG. 51 is a diagrammatic cross-sectional side view of the semiconductor construction of FIG. 45 shown at a processing stage subsequent to that of FIG. 49.
Figure 52:
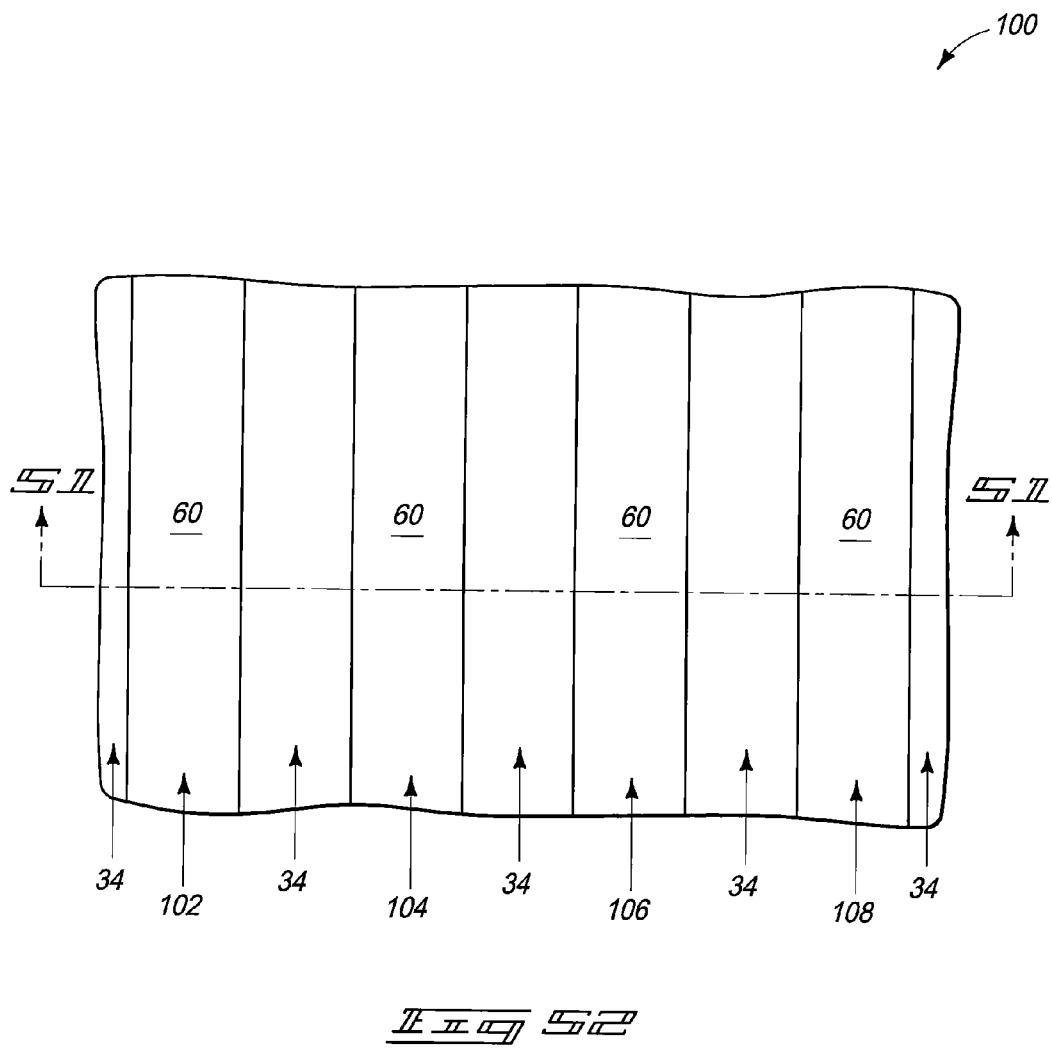
FIG. 52 is a diagrammatic top view of the semiconductor construction of FIG. 51. The cross-sectional view of FIG. 51 is along the line 51-51 of FIG. 52.

Referring to FIGS. 51 and 52, a pattern is transferred from hardmask 60 into carbon-containing material 58; and into the materials of gate stack 42. In some embodiments the pattern may be first transferred from the hardmask into the carbon-containing material with a first etch, and then transferred from the carbon-containing material into the gate stack with one or more subsequent etches.

The patterned gate stack forms a plurality of gate lines 102, 104, 106 and 108 extending linearly across an upper surface of base 40.

The masking materials 58 and 60 of FIGS. 45-52 are example masking materials, and in other embodiments one or both of the masking materials may be omitted; and/or alternative masking materials may be utilized. FIGS. 53-59 illustrate an embodiment similar to that of FIGS. 45-52, but in which masking material 60 is omitted.

Figure 53:
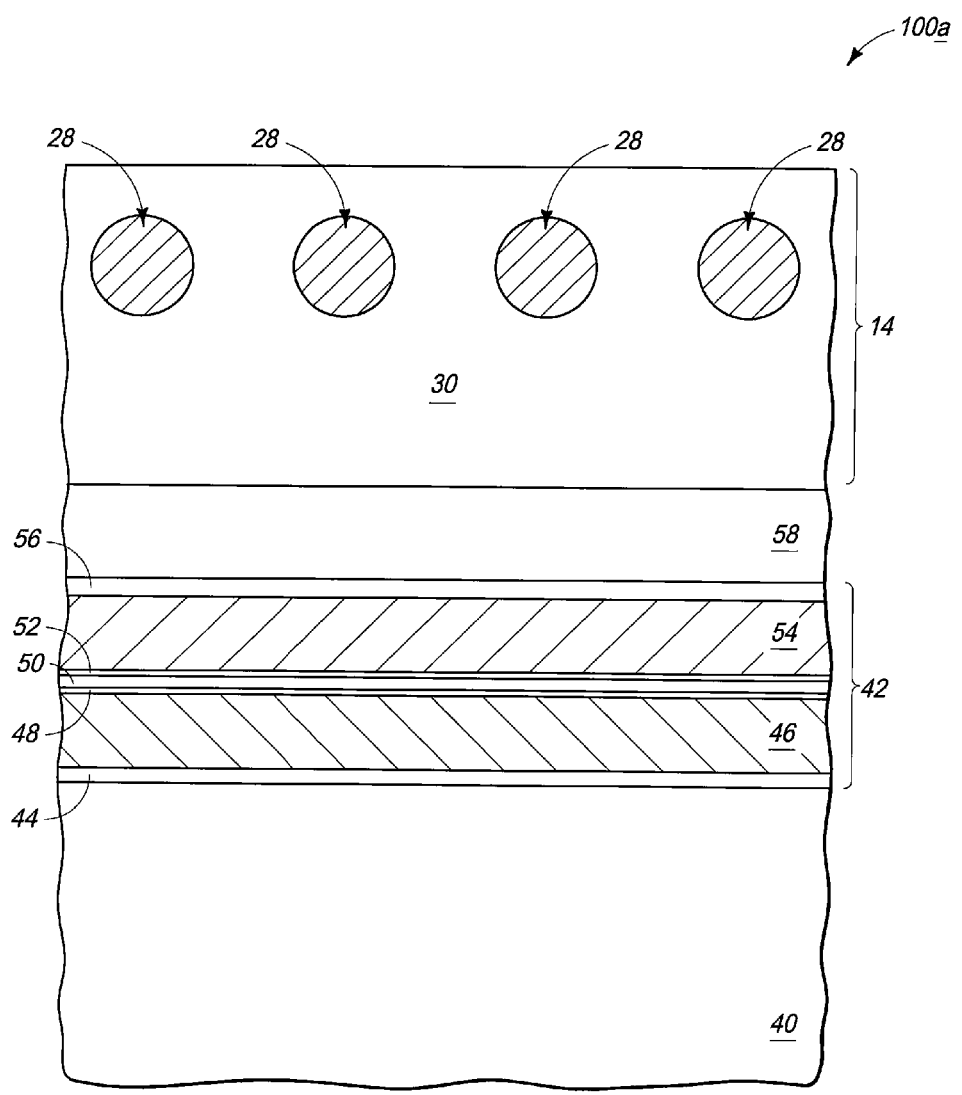
FIG. 53 is a diagrammatic cross-sectional side view of an example semiconductor construction at a processing stage analogous to that of FIG. 11 of another example embodiment.

Referring to FIG. 53, a semiconductor construction 100a is illustrated. The construction includes the base 40 having the gate stack 42 thereover; the carbon-containing masking material 58 over the gate stack, and the block copolymer assembly 14 over the masking material 58. The block copolymer assembly 14 has the same configuration as was discussed above with reference to FIG. 45.

Figure 54:
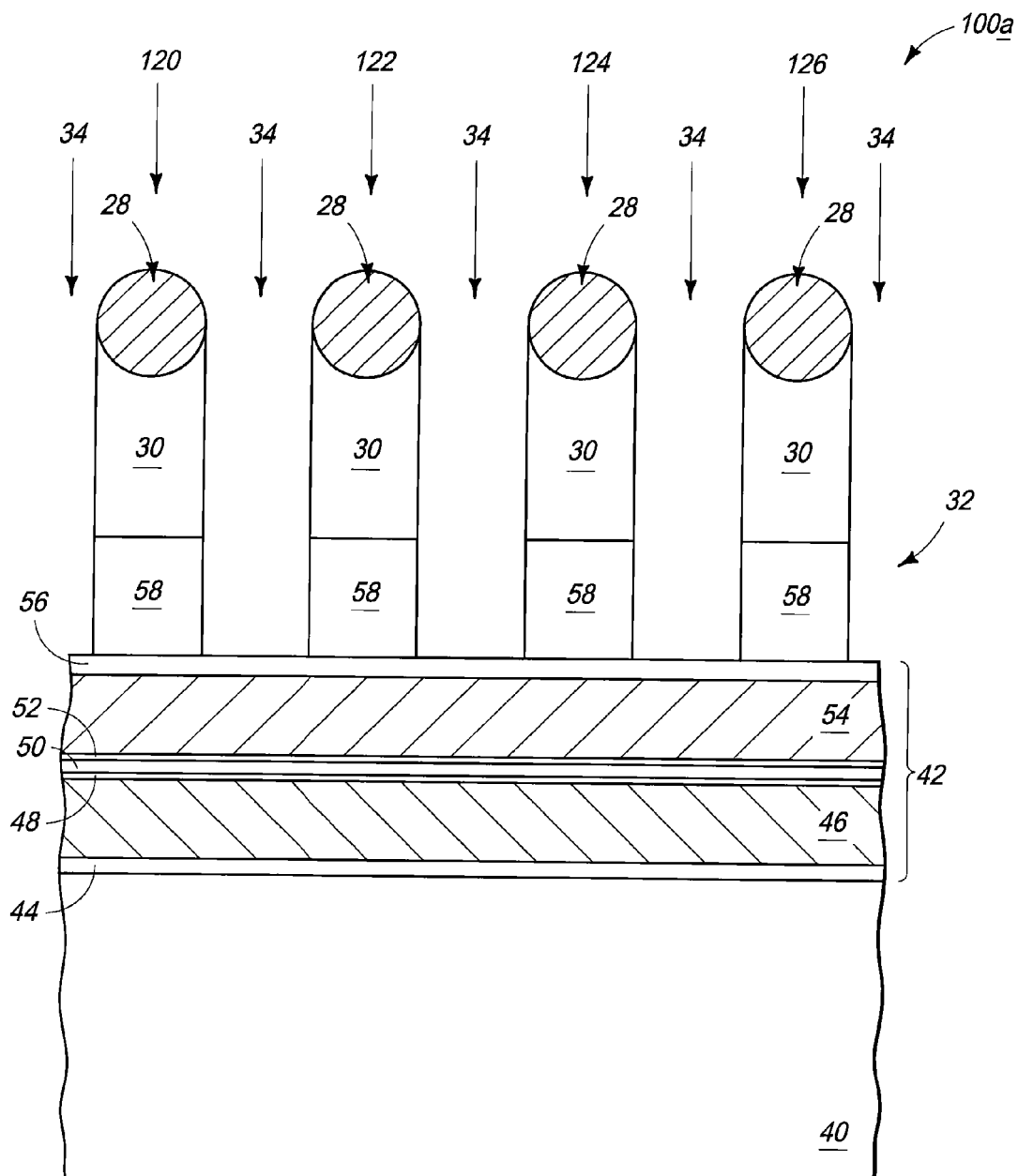
FIGS. 54 and 56-58 are diagrammatic cross-sectional side views of the semiconductor construction of FIG. 53 shown at a various processing stages subsequent to that of FIG. 53.
Figure 55:
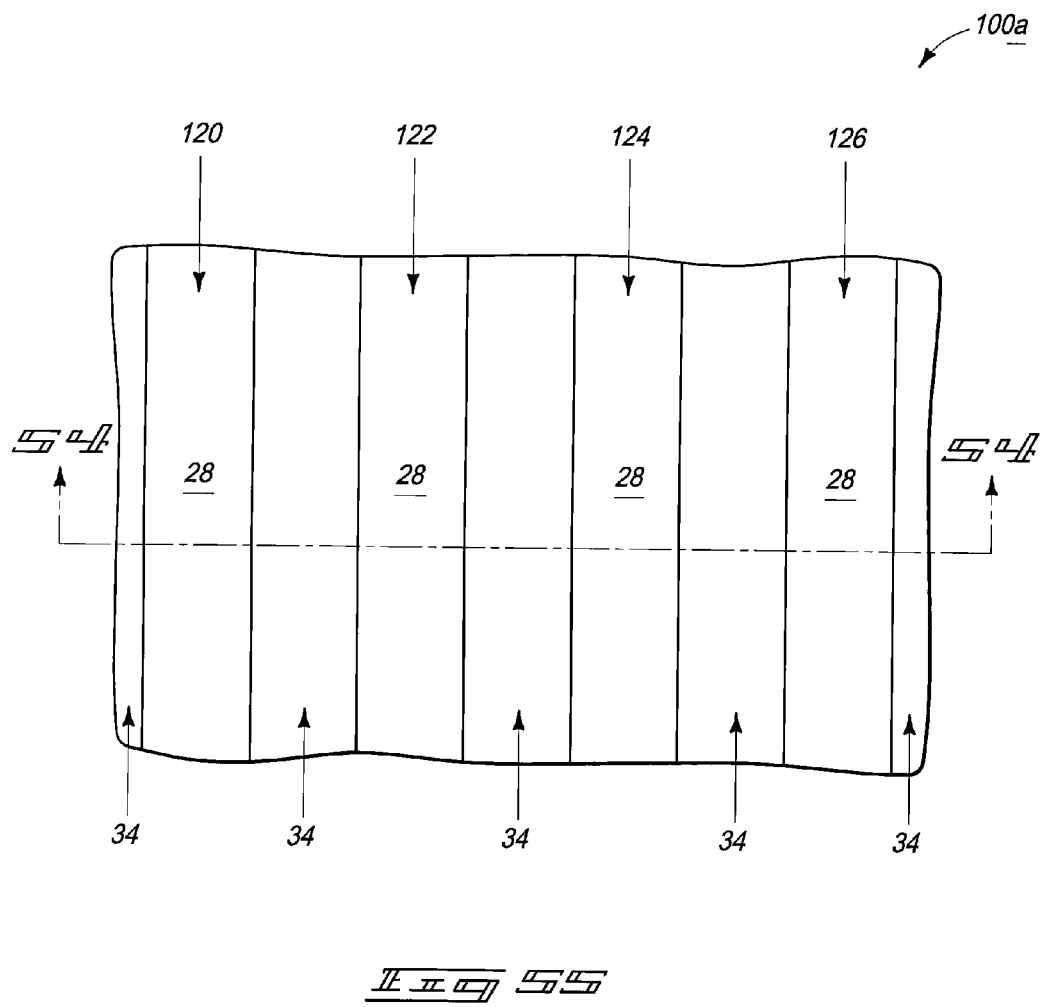
FIG. 55 is a diagrammatic top view of the semiconductor construction of FIG. 54. The cross-sectional view of FIG. 54 is along the line 54-54 of FIG. 55.

Referring to FIGS. 54 and 55, regions of matrix 30 are removed with processing of the type described above with reference to FIGS. 13 and 14. The processing also etches through carbon-containing material 58 to pattern the carbon-containing material. The remaining carbon-containing material 58, matrix material 30 and metal-containing material 28 form a patterned mask 32. The patterned mask comprises a plurality of lines 120, 122, 124 and 126, spaced from one another by gaps 34.

Figure 56:
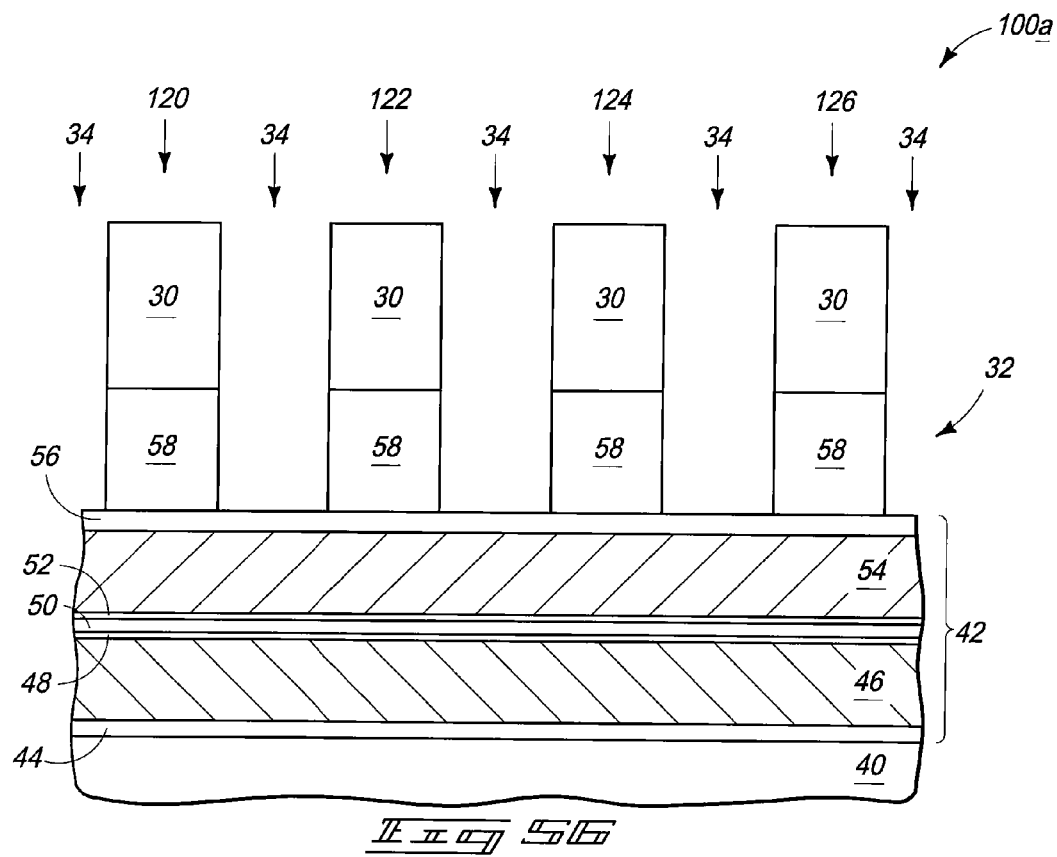

Referring to FIG. 56, metal-containing regions 28 (FIG. 54) are removed selectively relative to carbon-containing materials 58 and 30, and selectively relative to dielectric material 56. Such removal may utilize any suitable etch or etches. After the metal-containing regions are removed, the materials 58 and 30 remain as a patterned mask comprising features 120, 122, 124, and 126.

Figure 57:
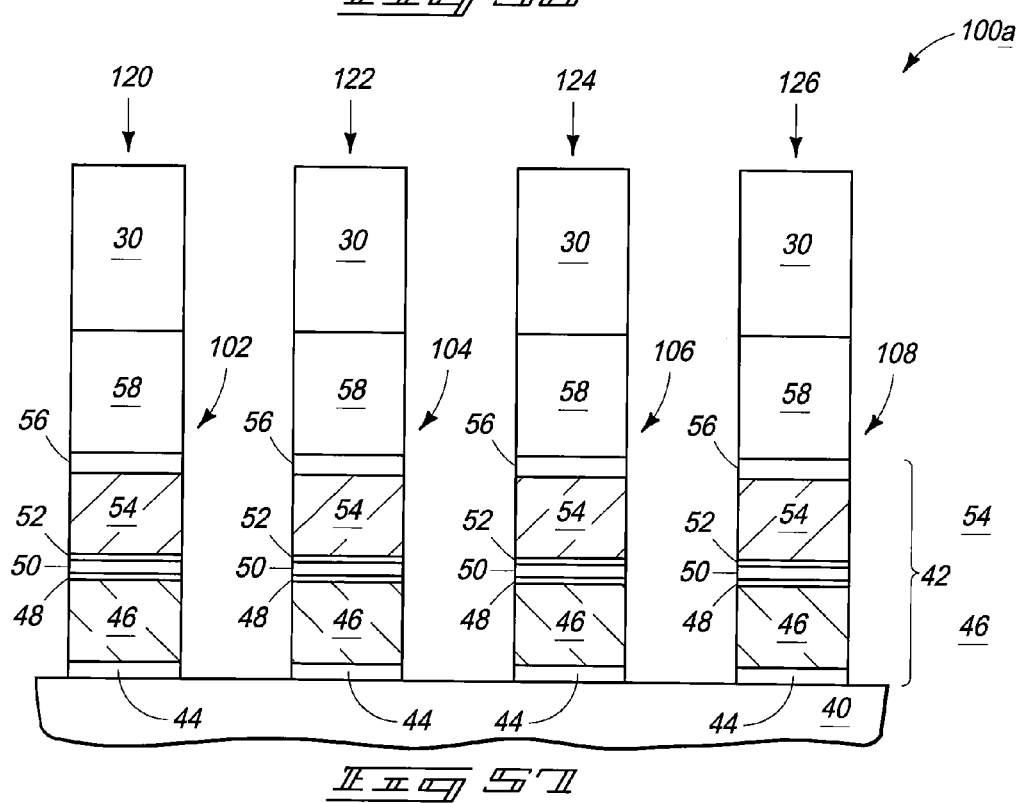

Referring to FIG. 57, one or more etches are utilized to transfer a pattern defined by mask 32 into the underlying gate stack 42. The patterning subdivides gate stack 42 into a plurality of lines 102, 104, 106 and 108.

Figure 58:
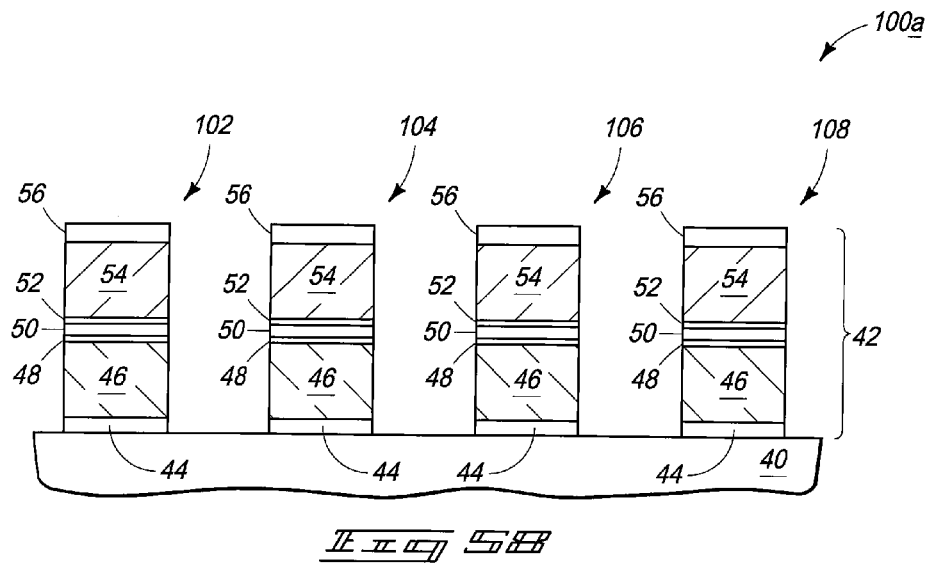
Figure 59:
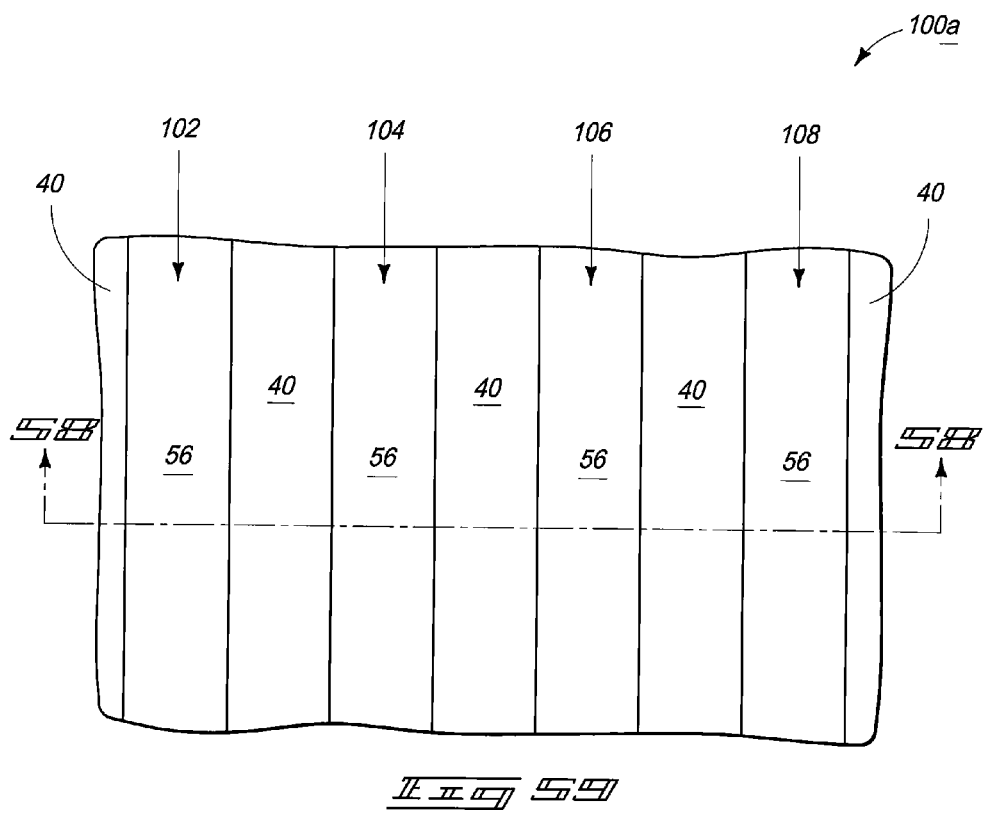
FIG. 59 is a diagrammatic top view of the semiconductor construction of FIG. 58. The cross-sectional view of FIG. 58 is along the line 58-58 of FIG. 59.

Referring to FIGS. 58 and 59, materials 30 and 58 (FIG. 57) are removed to leave the patterned lines 102, 104, 106 and 108 of materials from gate stack 42. Such lines may be subsequently incorporated into integrated circuitry, such as, for example, a NAND memory array.

The embodiments discussed above may be utilized in electronic systems, such as, for example, computers, cars, airplanes, clocks, cellular phones, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a pattern, comprising:
    forming a block copolymer assembly over a substrate, the block copolymer assembly having first and second subunits arranged in a pattern of at least two domains; one of the domains being a first matrix formed from the second subunits, and one of the domains being first features formed from the first subunits; the first features being entirely contained within the first matrix;
    exposing the block copolymer to first conditions that cause the first features to be disrupted so that a surface of the block copolymer comprises both the first and second subunits;
    after disrupting the first features, exposing the surface to metal-containing material to couple metal to the first subunits; the metal coupling to the first subunits selectively relative to the second subunits;
    exposing the block copolymer to second conditions that cause the block copolymer to redistribute such that the metal migrates from the surface into second features within a second matrix; the second matrix comprising the second subunits and the second features comprising the first subunits; the second features being entirely surrounded by the second matrix along at least one cross-section;
    removing at least some of the block copolymer to form a patterned mask containing the metal from the second features; and
    transferring a pattern defined by the patterned mask into the substrate with one or more etches.

2. The method of claim 1 wherein the first features are cylinders.

3. The method of claim 2 wherein the second features are cylinders.

4. The method of claim 1 wherein the first features are spheres.

5. The method of claim 4 wherein the second features are spheres.

6. The method of claim 1 wherein the metal comprises one or more of silicon, germanium, ruthenium, cobalt, nickel, titanium, tungsten, palladium, gold, copper, silver and iron.

7. The method of claim 1 wherein the coupling of the metal to the first subunits comprises coupling of metal-containing compound with the first subunits.

8. The method of claim 7 wherein the metal-containing compound is a metal oxide.

9. The method of claim 1 wherein the coupling of the metal to the first subunits comprises coupling of elemental metal with the first subunits.

10. A method of patterning a gate stack, comprising:
forming a gate stack over a semiconductor substrate;
forming a block copolymer assembly over the gate stack, the block copolymer assembly having a two or more domains arranged in a first pattern; the first pattern comprising a first matrix formed from second subunits, and comprising first features entirely contained within the first matrix; the first features being formed from first subunits;
exposing the block copolymer to first conditions that cause the first features to be disrupted so that the first subunits extrude through a surface of the block copolymer;
after disrupting the first features, exposing the surface to metal-containing material to couple metal to the first subunits; the metal coupling to the first subunits selectively relative to the second subunits;
exposing the block copolymer to second conditions that cause the block copolymer to redistribute such that the metal migrates from the surface into second features within a second matrix;
removing at least some of the block copolymer to form a patterned mask containing the metal from the second features; and
transferring a pattern defined by the patterned mask into the gate stack with one or more etches.

11. The method of claim 10 further comprising forming a hardmask over the gate stack, and forming the block copolymer over the hardmask; and wherein the transferring of the pattern into the gate stack comprises;
transferring the pattern from the patterned mask into the hardmask; and
transferring the pattern from the hardmask into the gate stack.

12. The method of claim 10 further comprising forming a carbon-containing material over the gate stack, and forming the block copolymer over the carbon-containing material; and wherein the transferring of the pattern into the gate stack comprises;
transferring the pattern from the patterned mask into the carbon-containing material; and
transferring the pattern from the carbon-containing material into the gate stack.

13. The method of claim 12 wherein the transferring of the pattern from the patterned mask into the carbon-containing material occurs simultaneously with the removing of the block copolymer.

14. The method of claim 12 further comprising forming a hardmask over the carbon-containing material; and wherein the transferring of the pattern from the patterned mask into the carbon-containing material comprises:
transferring the pattern from the patterned mask into the hardmask; and
transferring the pattern from the hardmask into the carbon-containing material.

15. The method of claim 10 wherein the first conditions include utilization of an acid, a base, or a substance that selectively attracts the first subunits relative to the second subunits.

16. The method of claim 10 wherein the gate stack includes, in ascending order from the substrate, a gate dielectric material, an electrically conductive gate material, and a capping dielectric material.

17. The method of claim 10 wherein the gate stack includes, in ascending order from the substrate, a gate dielectric material, a charge storage material, a body dielectric material, and a control gate material.

* * * * *